US012765220B2

(12) United States Patent
Choi et al.

(10) Patent No.: US 12,765,220 B2
(45) Date of Patent: Oct. 13, 2026

(54) DISPLAY DEVICE

(71) Applicant: SAMSUNG DISPLAY CO., LTD., Yongin-si (KR)

(72) Inventors: Min Oh Choi, Yongin-si (KR); Kwang Soo Bae, Yongin-si (KR); Gee Bum Kim, Yongin-si (KR); Bo Kwang Song, Yongin-si (KR); Soo Yeong Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 381 days.

(21) Appl. No.: 18/225,251

(22) Filed: Jul. 24, 2023

(65) Prior Publication Data

US 2024/0138229 A1 Apr. 25, 2024
US 2024/0237475 A9 Jul. 11, 2024

(30) Foreign Application Priority Data

Oct. 20, 2022 (KR) ........................ 10-2022-0135361

(51) Int. Cl.
*H10K 59/60* (2023.01)
*G06V 40/13* (2022.01)
(Continued)

(52) U.S. Cl.
CPC ......... *H10K 59/60* (2023.02); *G06V 40/1318* (2022.01); *H10F 39/8023* (2025.01);
(Continued)

(58) Field of Classification Search
CPC .... H10K 59/60; H10K 59/38; H10K 59/8791; H10K 50/865; H10K 59/122;
(Continued)

(56) References Cited

U.S. PATENT DOCUMENTS 10,847,586 B2 11/2020 Lee
11,744,135 B2 8/2023 Lim et al.
(Continued)

FOREIGN PATENT DOCUMENTS

KR 10-2020-0039859 A 4/2020
KR 10-2021-0069776 A 6/2021

OTHER PUBLICATIONS

Office Action issued in corresponding Korean Patent Application No. KR 10-2022-0135361 on Mar. 16, 2026.

*Primary Examiner* — David Vu
*Assistant Examiner* — Brandon C Fox
(74) *Attorney, Agent, or Firm* — F. CHAU & ASSOCIATES, LLC

(57) ABSTRACT

A display device including: a substrate; first to third light emitting portions on the substrate; a light sensing portion on the substrate and configured to sense an incident light, a light blocking layer having a light blocking opening that overlaps the light sensing portion; a first color filter on the first light emitting portion, and configured to transmit the first light, and block the second light and the third light; a second color filter on the second light emitting portion, overlapping the light blocking opening, and configured to transmit the second light, and block the first light and the third light; a third color filter on the third light emitting portion, and configured to transmit the third light, and block the first light and the second light; and a first light blocking pattern on the second color filter and overlapping a portion of the light blocking opening.

20 Claims, 24 Drawing Sheets

(51) Int. Cl.

| | |
|---|---|
| ***H10F 39/00*** | (2025.01) |
| ***H10K 50/86*** | (2023.01) |
| ***H10K 59/122*** | (2023.01) |
| ***H10K 59/38*** | (2023.01) |
| ***H10K 59/65*** | (2023.01) |
| ***H10K 59/80*** | (2023.01) |

(52) U.S. Cl.
CPC ....... *H10F 39/8053* (2025.01); *H10F 39/807* (2025.01); *H10K 50/865* (2023.02); *H10K 59/122* (2023.02); *H10K 59/38* (2023.02); *H10K 59/65* (2023.02); *H10K 59/8791* (2023.02)

(58) Field of Classification Search
CPC ................ H10K 59/65; G06V 40/1318; H10F 39/8023; H10F 39/8033; H10F 39/8053; H10F 39/807
See application file for complete search history.

(56) References Cited

U.S. PATENT DOCUMENTS

| | | | | |
|---|---|---|---|---|
| 2021/0064159 | A1 | 3/2021 | Yeke Yazdandoost et al. | |
| 2023/0112427 | A1* | 4/2023 | Yoo ......................... | G06F 21/32 257/40 |
| 2023/0209886 | A1* | 6/2023 | Lee ...................... | H10K 59/879 257/40 |
| 2023/0320169 | A1* | 10/2023 | Song ...................... | H10K 59/65 257/40 |
| 2023/0329073 | A1* | 10/2023 | Song .................. | G06V 40/1318 |
| 2024/0138227 | A1* | 4/2024 | Bae ........................ | H10K 59/38 |

* cited by examiner

DISPLAY DEVICE

This application claims priority under 35 U.S.C. § 119 to Korean Patent Application No. 10-2022-0135361, filed on Oct. 20, 2022, in the Korean Intellectual Property Office, the disclosure of which is incorporated by reference herein in its entirety.

1. TECHNICAL FIELD

The present disclosure relates to a display device.

2. DESCRIPTION OF THE RELATED ART

The demand for display devices that display images is rapidly increasing as the information society develops. These display devices are now used in a wide range of electronic devices such as smartphones, digital cameras, notebook computers, navigation devices, smart watches, and smart televisions. Flat panel display devices, including liquid crystal display devices, field emission display devices, and organic light emitting display devices, are some of the most commonly used display technologies.

In recent times, there has been a surge in research and development of integrating touch recognition or fingerprint recognition sensors into display devices. To enhance the accuracy of fingerprint sensing, the optical hole's size, which is the region that allows light to reach each light-sensing portion, should be minimized. Therefore, various studies are being conducted to reduce the optical hole area, such as reducing the area of an opening in a light-blocking layer or adjusting the distance between the opening and each light sensing portion.

SUMMARY

Embodiments of the present disclosure provide a display device which can increase the accuracy of fingerprint sensing by reducing the area of an optical hole.

According to an embodiment of the present disclosure, there is provided a display device including: a substrate; a first light emitting portion disposed on the substrate and configured to emit a first light; a second light emitting portion disposed on the substrate and configured to emit a second light; a third light emitting portion disposed on the substrate and configured to emit a third light; a light sensing portion disposed on the substrate and configured to sense an incident light; a light blocking layer having a light blocking opening that overlaps the light sensing portion; a first color filter disposed on the first light emitting portion, and configured to transmit the first light, and block the second light and the third light; a second color filter disposed on the second light emitting portion, overlapping the light blocking opening, and configured to transmit the second light, and block the first light and the third light; a third color filter disposed on the third light emitting portion, and configured to transmit the third light, and block the first light and the second light; and a first light blocking pattern disposed on the second color filter and overlapping a portion of the light blocking opening.

The first light blocking pattern is made of the same material as the first color filter or the third color filter.

The first light blocking pattern extends in a first direction and protrudes in a second direction intersecting the first direction.

The display device further includes a second light blocking pattern disposed on the first light blocking pattern, overlapping the first light blocking pattern, and overlapping a portion of the light blocking opening.

The first light blocking pattern is made of the same material as the first color filter, and the second light blocking pattern is made of the same material as the third color filter.

The first light is a light of a red wavelength band, and the second light is a light of a blue wavelength band.

The display device further includes a bank layer disposed on the substrate and separating the first light emitting portion, the second light emitting portion, the third light emitting portion, and the light sensing portion, wherein a portion of the light blocking opening overlaps the bank layer, and the first light blocking pattern overlaps the bank layer.

A portion of the light blocking opening which does not overlap the first light blocking pattern is an optical hole, and a width of the optical hole is smaller than a width of the light blocking opening and greater than a width of the light sensing portion.

The width of the optical hole is 10/7 to 2 times the width of the light sensing portion.

The light blocking layer further includes: a first light emitting opening overlapping the first light emitting portion; and a second light emitting opening overlapping the second light emitting portion, wherein a minimum distance between the first light emitting opening and the light blocking opening is smaller than a minimum distance between the first light emitting opening and the first light blocking pattern.

A distance between a center of the first light emitting opening and a center of the light blocking opening is greater than a distance between the center of the first light emitting opening and a center of the light sensing portion.

The display device further includes: a light emitting layer disposed on the substrate in each of the first, second and third light emitting portions; a photoelectric conversion layer disposed on the substrate in the light sensing portion; and a common electrode disposed on the light emitting layer and the photoelectric conversion layer, wherein the photoelectric conversion layer overlaps the light blocking opening.

According to an embodiment of the present disclosure, there is provided a display device including: a substrate; a plurality of light emitting portions disposed on the substrate and configured to emit a light; a plurality of light sensing portions disposed on the substrate and configured to sense an incident light; a light blocking layer disposed on the light sensing portions and having a light blocking opening that overlaps each of the light sensing portions; and a first light blocking pattern disposed on the light blocking layer, wherein the light emitting portions include: a first light emitting portion disposed adjacent to a first side of any one of the light sensing portions in a first direction; and a second light emitting portion disposed adjacent to a second side of the any one of the light sensing portions in the first direction; wherein a first distance between a center of the light blocking opening and a center of the first light emitting portion is smaller than a second distance between the center of the light blocking opening and a center of the second light emitting portion, and the second distance is greater than a third distance between a center of the first light blocking pattern and the center of the first light emitting portion.

The first light blocking pattern overlaps a portion of the light blocking opening and does not overlap each of the light sensing portions.

A fourth distance between the center of the light blocking opening and a center of the light sensing portion is smaller than a width of the light sensing portion.

The fourth distance is less than 4/7 times of the width of the light sensing portion.

A fifth distance between the center of the first light blocking pattern and the center of the light blocking opening is smaller than the width of the light sensing portion.

The display device further includes: a third light emitting portion disposed adjacent to the first side of the any one of the light sensing portions in a second direction intersecting the first direction; and a fourth light emitting portion disposed adjacent to the second side of the any one of the light sensing portions in the second direction, wherein a distance between the center of the light blocking opening and a center of the third light emitting portion is smaller than a distance between the center of the light blocking opening and a center of the fourth light emitting portion, and the first light blocking pattern overlaps a portion of the light blocking opening in the second direction.

According to an embodiment of the present disclosure, there is provided a display device including: a substrate; a first light emitting portion disposed on the substrate and configured to emit a first light; a second light emitting portion disposed on the substrate and configured to emit a second light; a third light emitting portion disposed on the substrate and configured to emit a third light; a light sensing portion disposed on the substrate and configured to sense an incident light; a light blocking layer having a light blocking opening that overlaps the light sensing portion; a first color filter disposed on the first light emitting portion, and configured to transmit the first light, and block the second light and the third light; a second color filter disposed on the second light emitting portion, overlapping the light blocking opening, and configured to transmit the second light, and block the first light and the third light; a third color filter disposed on the third light emitting portion, and configured to transmit the third light, and block the first light and the second light; a first light blocking pattern disposed on the light blocking layer and overlapping a portion of the light blocking opening; and a second light blocking pattern disposed on the first light blocking pattern and overlapping the first light blocking pattern.

The first light blocking pattern is made of the same material as the first color filter, and the second light blocking pattern is made of the same material as the third color filter.

In a display device according to embodiments of the present disclosure, the area of an optical hole may be reduced by placing the center of a light blocking opening adjacent to a first side of a light sensing portion and placing a light blocking pattern adjacent to a second side of the light sensing portion. This approach allows for a reduction in size of the optical hole in the display device, leading to increased accuracy of fingerprint sensing.

BRIEF DESCRIPTION OF THE DRAWINGS

The above and/or other features of the present disclosure will become apparent and more readily appreciated from the following description of the embodiments, taken in conjunction with the accompanying drawings in which.

DETAILED DESCRIPTION OF THE EMBODIMENTS

The present disclosure will now be described more fully hereinafter with reference to the accompanying drawings. This disclosure may, however, be embodied in different forms and should not be construed as limited to the embodiments set forth herein.

It will be understood that when a layer is referred to as being "on" another layer or substrate, it can be directly on the other layer or substrate, or intervening layers may also be present. The same reference numbers may indicate the same components throughout the specification.

It will also be understood that, although the terms "first," "second," etc. may be used herein to describe various elements, these elements should not be limited by these terms. These terms are used to distinguish one element from another element. For instance, a first element discussed below could be termed a second element. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in association.

Hereinafter, embodiments of the present disclosure will be described with reference to the accompanying drawings.

Figure 1:
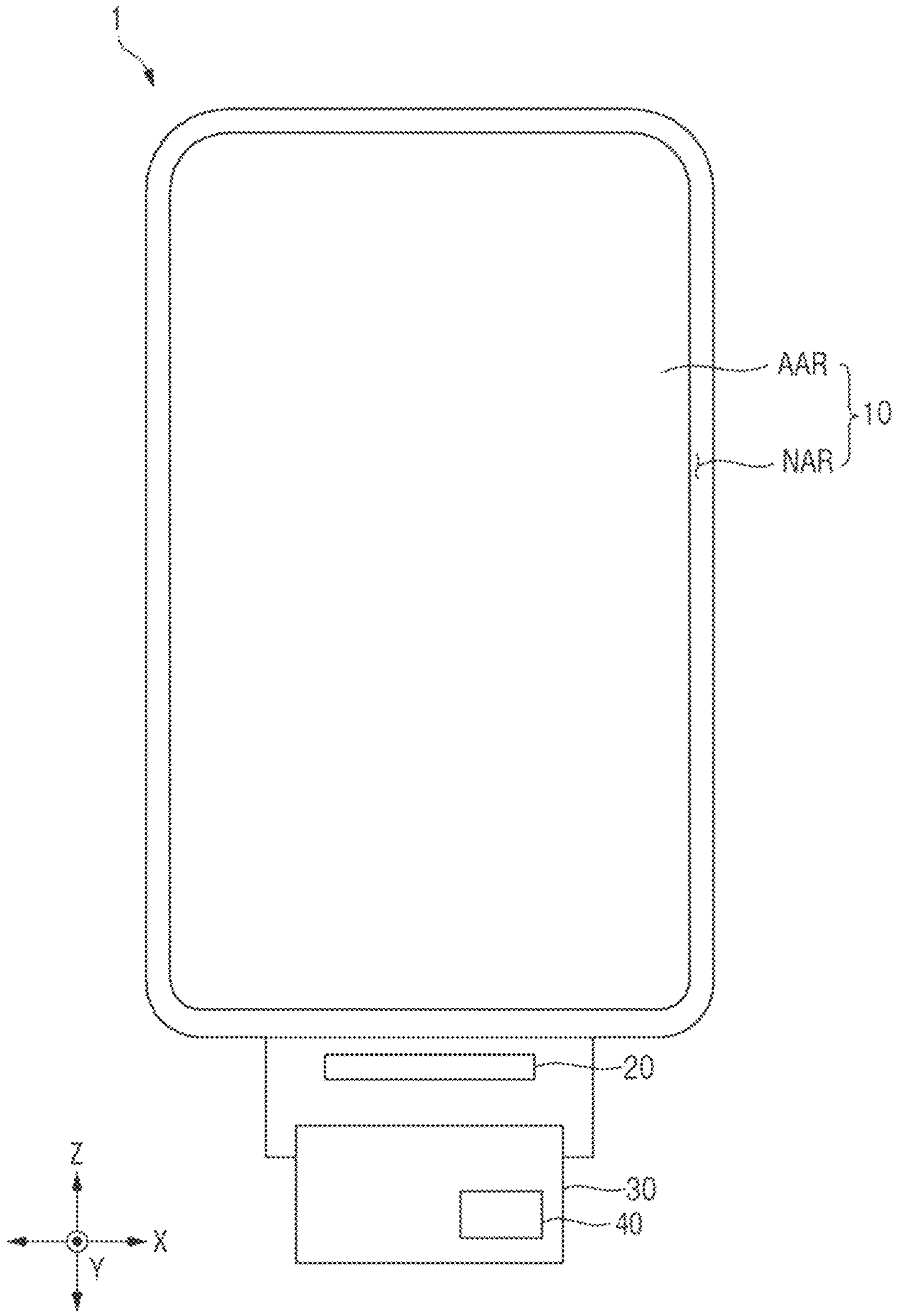
FIG. 1 is a plan view of a display device according to an embodiment of the present disclosure.

FIG. 1 is a plan view of a display device 1 according to an embodiment.

In FIG. 1, a first direction X, a second direction Y, and a third direction Z are shown. The first direction X may be a direction parallel to a side of the display device 1 when seen in a plan view, for example, a horizontal direction of the display device 1. The second direction Y may be a direction parallel to another side in contact with the above side of the display device 1 when seen in a plan view, for example, a vertical direction of the display device 1. For ease of description, a side in the first direction X refers to a right direction in a plan view, the other side in the first direction X refers to a left direction in a plan view, one side in the second direction Y refers to an upward direction in a plan view, and the other side in the second direction Y refers to a downward direction in a plan view. The third direction Z may be a thickness direction of the display device 1. However, directions mentioned in the embodiments should be understood as relative directions, and the embodiments are not limited to the mentioned directions.

Unless otherwise defined, the terms "upper" and "upper surface" used herein based on the third direction Z refer to a display surface side of a display panel 10, and the terms "lower," "lower surface" and "back surface" refer to an opposite side of the display panel 10 from the display surface side.

Referring to FIG. 1, examples of the display device 1 may include various electronic devices that provide a display screen. Examples of the display device 1 may include, but are not limited to, a mobile phone, a smartphone, a tablet personal computer (PC), a mobile communication terminal, an electronic notebook, an electronic book, a personal digital assistant (PDA), a portable multimedia player (PMP), a navigation device, an ultra-mobile PC (UMPC), a television, a game console, a wristwatch-type electronic device, a head mounted display, a monitor of a PC, a notebook computer, a car dashboard, a digital camera, a camcorder, an outdoor billboard, an electronic display board, various medical devices, various examination devices, various home appliances including a display area such as a refrigerator and a washing machine, and an Internet of things (IoT) device. A representative example of the display device 1 to be described below may be, but is not limited to, a smartphone, a tablet PC, or a notebook computer.

Figure 2:
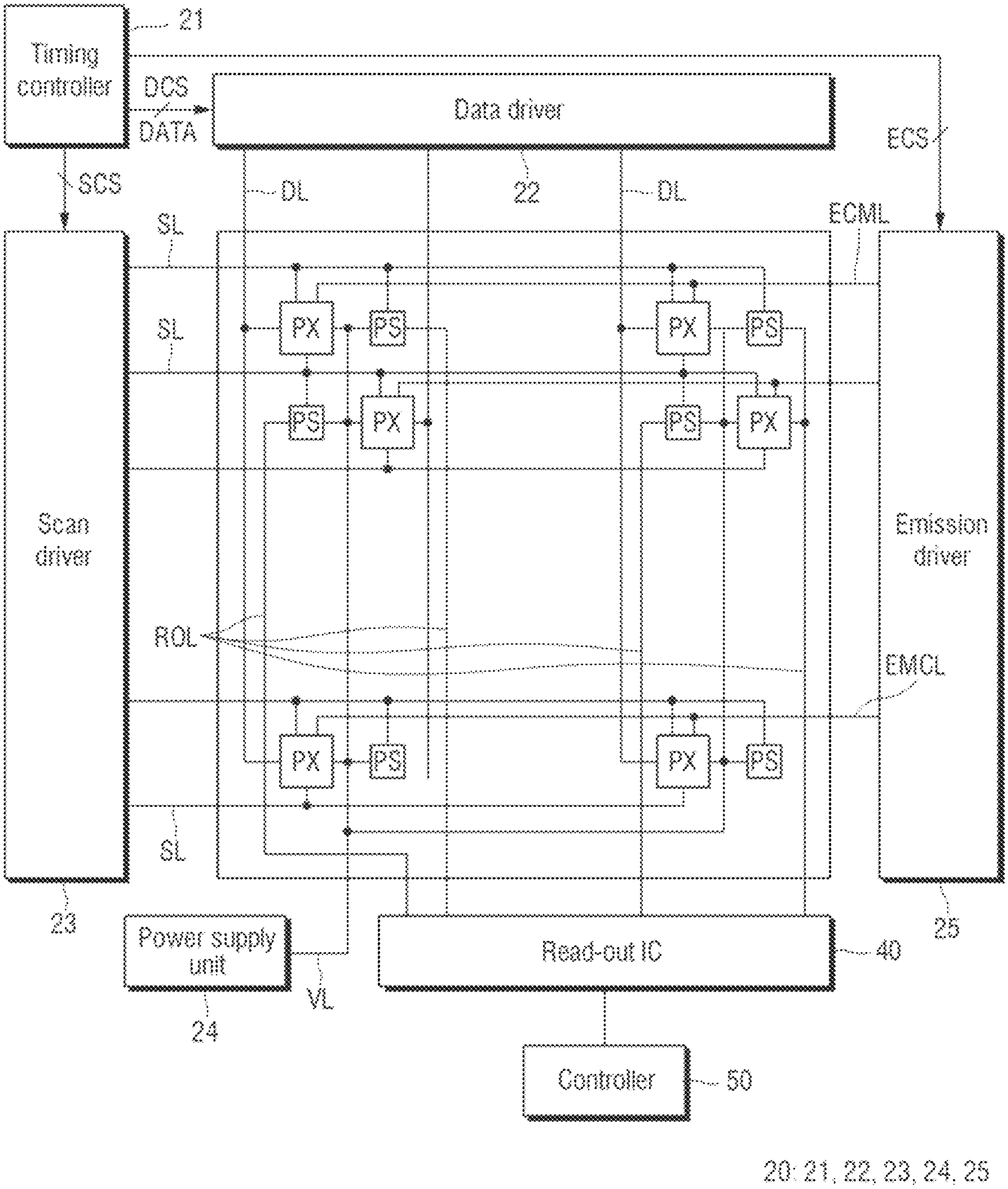
FIG. 2 is a block diagram of the display device according to the embodiment.

The display device 1 may include the display panel 10, a panel driving circuit 20, a circuit board 30, a readout circuit 40, and a controller 50 (see FIG. 2).

The display device 1 includes the display panel 10 having an active area AAR and a non-active area NAR. The active area AAR includes a display area, which is used for displaying a screen. In some cases, the active area AAR may completely overlap the display area. A plurality of pixels PX (see FIG. 2) for displaying an image may be disposed in the display area. Each pixel PX may include a light emitting element EL (see FIG. 9).

In addition, the active area AAR includes a fingerprint sensing area, which is designed to react to light and detect the quantity or wavelength of incident light. The fingerprint sensing area may overlap the display area. For example, the fingerprint sensing area may be positioned in a specific area required for fingerprint recognition within the active area AAR. In this case, the fingerprint sensing area may overlap a part of the display area but may not overlap other parts of the display area. In another example, the fingerprint sensing area may be an area exactly the same as the active area AAR. In this case, the entire active area AAR may be utilized as an area for fingerprint sensing. A plurality of photo sensors PS (see FIG. 2) that react to light may be disposed in the fingerprint sensing area. Each of the photo sensors PS may include a photoelectric converter PD (see FIG. 9) that senses incident light and converts the incident light into an electrical signal.

The non-active area NAR is disposed around the active area AAR. The non-active area NAR may be a bezel area. The non-active area NAR may surround all sides (four sides in FIG. 1) of the active area AAR, but the present disclosure is not limited thereto. For example, the non-active area NAR may be disposed around fewer than all sides of the active area AAR.

The panel driving circuit 20 may be disposed in the non-active area NAR. The panel driving circuit 20 may drive the pixels PX and/or the photo sensors PS. The panel driving circuit 20 may output signals and voltages for driving the display panel 10. The panel driving circuit 20 may be formed as an integrated circuit and mounted on the display panel 10. In the non-active area NAR, signal wirings for transmitting signals between the panel driving circuit 20 and the active area AAR may be further disposed. In another example, the panel driving circuit 20 may be mounted on the circuit board 30.

In addition, signal wirings or the readout circuit 40 for transmitting signals to the active area AAR may be disposed in the non-active area NAR. The readout circuit 40 may be connected to each photo sensor PS through a signal wiring and may receive a current flowing through each photo sensor PS to sense a user's fingerprint input. In other words, the readout circuit 40 can sense a user's fingerprint input by receiving the current flowing through each photo sensor PS. The readout circuit 40 may be formed as an integrated circuit and attached onto a display circuit board using a chip on film (COF) method. However, the present disclosure is not limited thereto, and the readout circuit 40 may also be attached onto the non-active area NAR of the display panel 10 using a chip on glass (COG) method, a chip on plastic (COP) method, or an ultrasonic bonding method.

The circuit board 30 may be attached to an end of the display panel 10 using an anisotropic conductive film (ACF). Lead wirings of the circuit board 30 may be electrically connected to a pad portion of the display panel 10. The circuit board 30 may be a flexible film such as a flexible printed circuit board or a chip on film.

FIG. 2 is a block diagram of the display device 1 according to the embodiment.

Referring to FIG. 2, the pixels PX and the photo sensors PS disposed in the active area AAR of the display panel 10 may be driven by the panel driving circuit 20.

The panel driving circuit 20 includes a data driver 22 for driving the pixels PX, a scan driver 23 for driving the pixels PX and the photo sensors PS, and a timing controller 21 for controlling driving timings of the data driver 22 and the scan driver 23. In addition, the panel driving circuit 20 may further include a power supply unit 24 and an emission control driver 25.

The timing controller 21 receives an image signal supplied from outside the display device 1. The timing controller 21 may output image data DATA and a data control signal DCS to the data driver 22. In addition, the timing controller 21 may generate a scan control signal SCS for controlling the operation timing of the scan driver 23 and an emission control driving signal ECS for controlling the operation timing of the emission control driver 25. For example, the timing controller 21 may generate the scan control signal SCS and the emission control driving signal ECS and may output the scan control signal SCS to the scan driver 23 through a scan control wiring and output the emission control driving signal ECS to the emission control driver 25 through an emission control driving wiring.

The data driver 22 may convert the image data DATA into analog data voltages and output the analog data voltages to data wirings DL. The scan driver 23 may generate scan signals according to the scan control signal SCS and sequentially output the scan signals to scan wirings SL.

The power supply unit 24 may generate a driving voltage ELVDD (see FIG. 16) and supply the driving voltage ELVDD to a power supply voltage wiring VL and may generate a common voltage ELVSS (see FIG. 16) and supply the common voltage ELVSS to the power supply voltage wiring VL. The power supply voltage wiring VL may include a driving voltage wiring and a common voltage wiring. The driving voltage ELVDD may be a high potential voltage for driving light emitting elements and photoelectric converters, and the common voltage ELVSS may be a low potential voltage for driving the light emitting elements and the photoelectric converters. In other words, the driving voltage ELVDD may have a higher potential than the common voltage ELVSS.

The emission control driver 25 may generate emission control signals according to the emission control driving signal ECS and sequentially output the emission control signals to emission control wirings ECML. Although the emission control driver 25 is illustrated as being separate from the scan driver 23, the present disclosure is not limited thereto, and the emission control driver 25 may also be included in the scan driver 23.

The readout circuit 40 may be connected to each photo sensor PS through a readout wiring ROL and may receive a current flowing through each photo sensor PS to sense a user's fingerprint input. The readout circuit 40 may generate fingerprint sensing data according to the magnitude of a current sensed by each photo sensor PS and transmit the fingerprint sensing data to the controller 50. In other words, the readout circuit 40 can generate fingerprint sensing data based on the current sensed by each photo sensor PS and then transfer this data to the controller 50. The controller 50 may receive the fingerprint sensing data from the readout circuit 40. The controller 50 may analyze the fingerprint sensing data and determine whether the fingerprint sensing data matches a user's fingerprint by comparing the fingerprint sensing data with a preset fingerprint. When the preset fingerprint and the fingerprint sensing data transmitted from the readout circuit 40 are the same, preset functions may be performed.

The display panel 10 further includes a plurality of pixels PX, a plurality of photo sensors PS, a plurality of scan wirings SL connected to the pixels PX and the photo sensors PS, a plurality of data wirings DL and a plurality of emission control wirings ECML connected to the pixels PX, and a plurality of readout wirings ROL connected to the photo sensors PS.

Each of the pixels PX may be connected to at least any one of the scan wirings SL, any one of the data wirings DL, at least one of the emission control wirings ECML, and the power supply voltage wiring VL.

Each of the photo sensors PS may be connected to any one of the scan wirings SL, any one of the readout wirings ROL, and the power supply voltage wiring VL.

The scan wirings SL may connect the scan driver 23 to the pixels PX and the photo sensors PS. The scan wirings SL may provide scan signals output from the scan driver 23 to the pixels PX and the photo sensors PS.

The data wirings DL may connect the data driver 22 to the pixels PX. The data wirings DL may provide image data output from the data driver 22 to the pixels PX.

The emission control wirings ECML may connect the emission control driver 25 to the pixels PX. The emission control wirings ECML may provide emission control signals output from the emission control driver 25 to the pixels PX.

The readout wirings ROL may connect the photo sensors PS to the readout circuit 40. The readout wirings ROL may provide a sensing current generated according to a photocurrent output from each of the photo sensors PS to the readout circuit 40. Accordingly, the readout circuit 40 may detect a user's fingerprint.

A plurality of power supply voltage wirings VL may connect the power supply unit 24 to the pixels PX and the photo sensors PS. The power supply voltage wirings VL may provide the driving voltage ELVDD or the common voltage ELVSS received from the power supply unit 24 to the pixels PX and the photo sensors PS.

Figure 3:
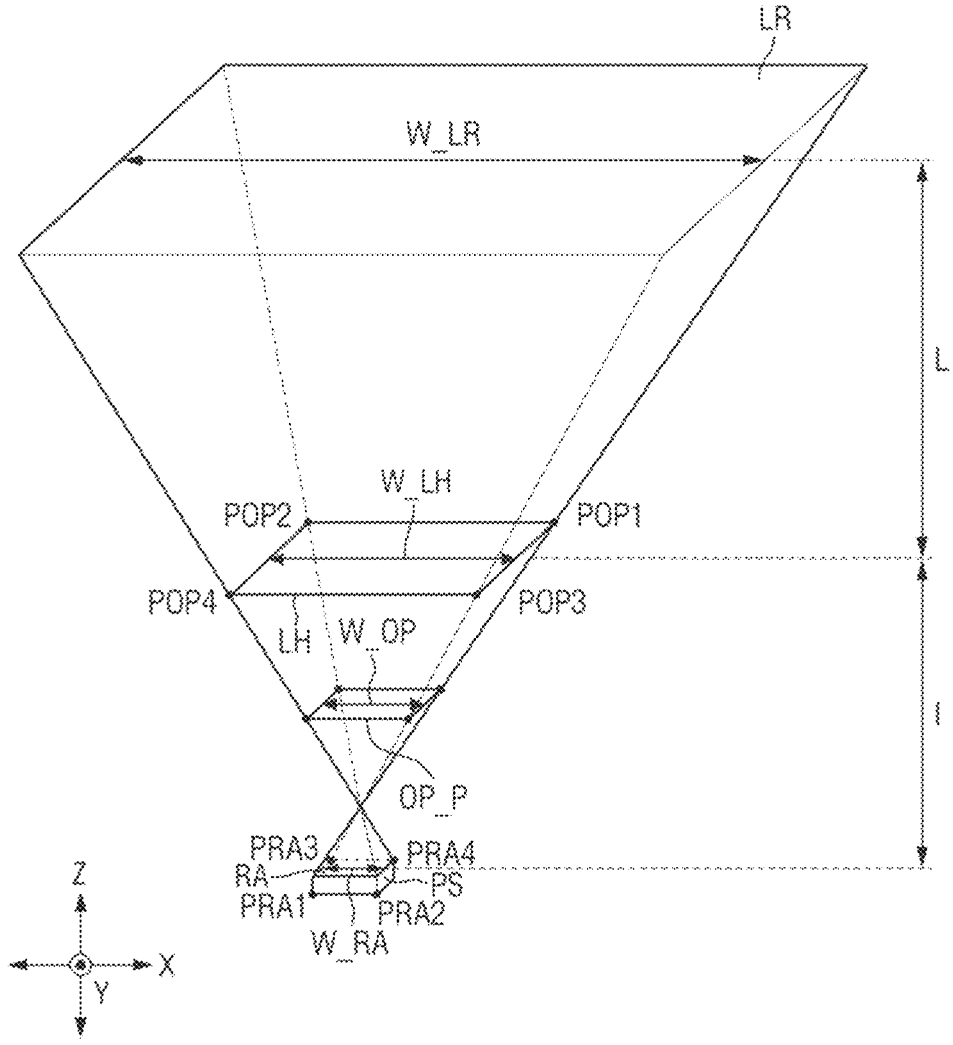
FIG. 3 illustrates an example of a region of light incident on a light sensing portion of the display device according to the embodiment.
Figure 4:
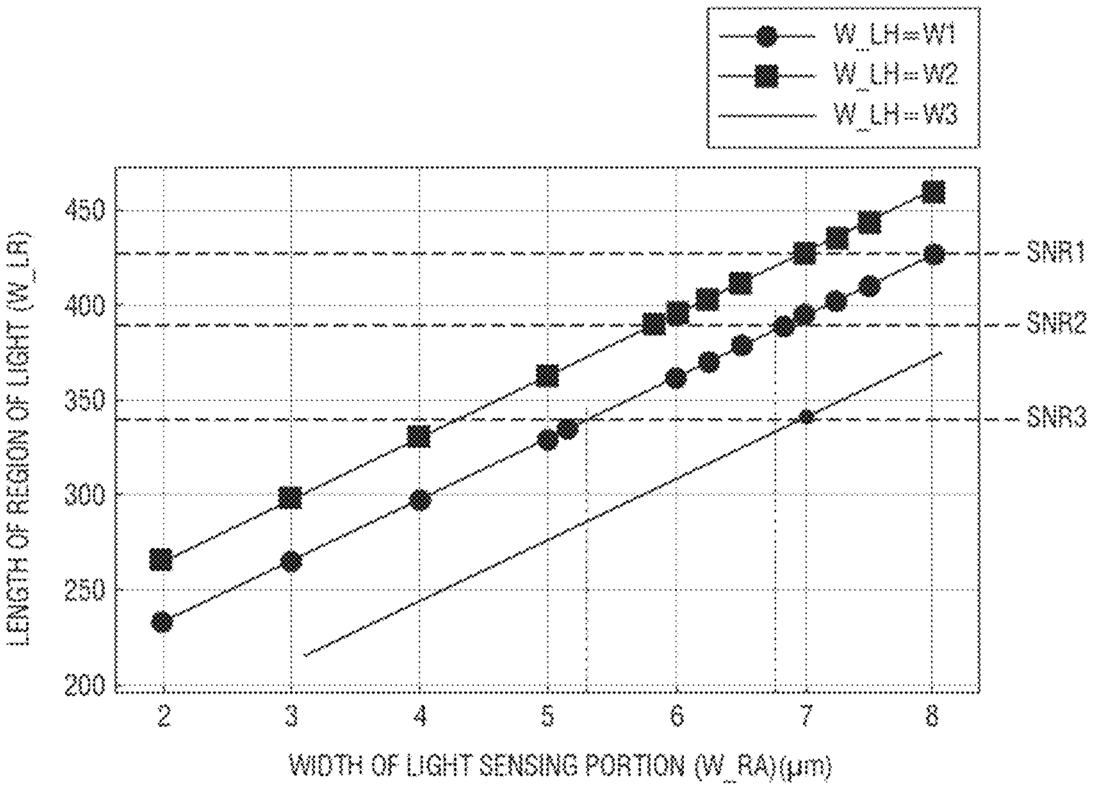
FIG. 4 is a graph illustrating the region of light incident on the light sensing portion with respect to the width of the light sensing portion of the display device according to the embodiment.

FIG. 3 illustrates an example of a region of light incident on a light sensing portion RA of the display device 1 according to the embodiment. FIG. 4 is a graph illustrating the region of light incident on the light sensing portion RA with respect to the width of the light sensing portion RA of the display device 1 according to the embodiment.

Referring to FIGS. 3 and 4, as a region (or area) LR of light incident on each light sensing portion RA decreases, an area for acquiring a fingerprint F (see FIG. 14) may decrease. As the area for acquiring the fingerprint F decreases, ridges RR (see FIG. 14) or valleys V (see FIG. 14) of the fingerprint F can be accurately sensed, thereby increasing the accuracy of fingerprint sensing.

Figure 9:
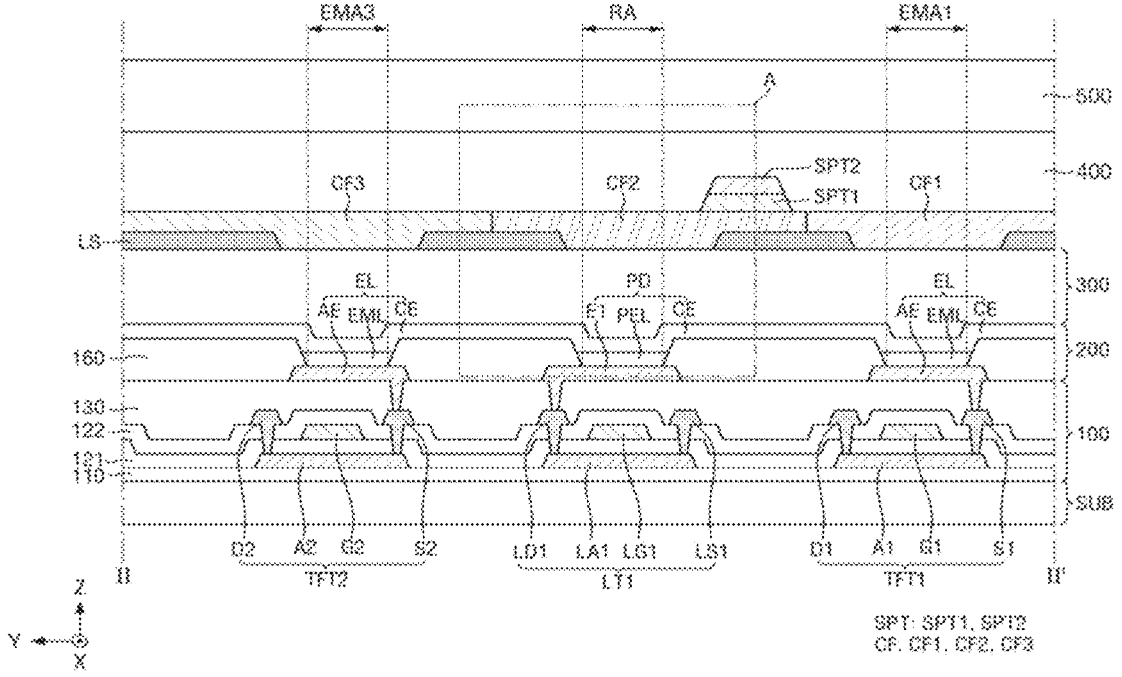
FIG. 9 is a cross-sectional view taken along line II-II' of FIG. 8.

A fingerprint sensing area LR incident on a light sensing portion RA may be set by points at which a line connecting a first vertex PRA1 of an upper surface of the light sensing portion RA and a first vertex POP1 of an optical hole LH, a line connecting a second vertex PRA2 of the upper surface of the light sensing portion RA and a second vertex POP2 of the optical hole LH, a line connecting a third vertex PRA3 of the upper surface of the light sensing portion RA and a third vertex POP3 of the optical hole LH, and a line connecting a fourth vertex PRA4 of the upper surface of the light sensing portion RA and a fourth vertex POP4 of the optical hole LH meet an upper surface of a cover window 500 (see FIG. 9). In addition, the fingerprint sensing area LR incident on the light sensing portion RA may be set by points at which lines connecting the vertices of the upper surface of the light sensing portion RA and vertices of a light blocking opening OP_P meet the upper surface of the cover window 500.

Therefore, the fingerprint sensing area LR incident on the light sensing portion RA may vary according to a width W_RA of the light sensing portion RA, a width W_OP of the light blocking opening OP_P of a light blocking layer LS (see FIG. 9), a width W_LH of the optical hole LH, a distance L between the optical hole LH and the cover window 500, and a distance I between the optical hole LH and a photo sensor PS.

For example, as the width W_RA of the light sensing portion RA decreases, the fingerprint sensing area LR incident on the light sensing portion RA may decrease. In another example, as the width W_LH of the optical hole LH decreases, the fingerprint sensing area LR incident on the light sensing portion RA may decrease. In another example, as the width W_OP of the light blocking opening OP_P decreases, the fingerprint sensing area LR incident on the light sensing portion RA may decrease. In addition, as the distance L between the optical hole LH and the cover window 500 decreases, the fingerprint sensing area LR incident on the light sensing portion RA may decrease, and as the distance l between the optical hole LH and the photo sensor PS increases, the fingerprint sensing area LR incident on the light sensing portion RA may decrease. In addition, as the distance L between the light blocking layer LS and the cover window 500 decreases, the fingerprint sensing area LR incident on the light sensing portion RA may decrease, and as the distance between the light blocking layer LS and the photo sensor PS increases, the fingerprint sensing area LR incident on the light sensing portion RA may decrease.

Referring to the graph of FIG. 4, as the width W_RA of the light sensing portion RA decreases, the fingerprint sensing area LR (or a length W_LR in one direction) incident on the light sensing portion RA may also decrease. For example, the length W_LR of the fingerprint sensing area LR incident on the light sensing portion RA may be smaller when the width W_RA of the light sensing portion RA is 7 or 5 μm than when the width W_RA of the light sensing portion RA is 8 μm. In addition, as the width W_LH of the optical hole LH decreases, the fingerprint sensing area LR (or the length W_LR in one direction) incident on the light sensing portion RA may also decrease. For example, when a first width W1 is greater than a second width W2 and the second width W2 is greater than a third width W3, the length W_LR of the fingerprint sensing area LR may be smaller when the width W_LH of the optical hole LH is the second width W2 than when the width W_LH of the optical hole LH is the first width W1. In addition, the length W_LR of the fingerprint sensing area LR may be smaller when the width W_LH of the optical hole LH is the third width W3 than when the width W_LH of the optical hole LH is the second width W2. Furthermore, the length W_LR of the fingerprint sensing area LR may be smaller when the width W_LH of the optical hole LH is the second width W2 than when the width W_LH of the optical hole LH is the first width W1. In other words, as the width W_LH of the optical hole LH increases, the length W_LR of the fingerprint sensing area LR incident on the light sensing portion RA may increase.

As the width W_LH of the optical hole LH decreases, a signal-to-noise ratio may increase. The signal-to-noise ratio is a ratio of the level of a signal to the level of a noise signal. As the signal-to-noise ratio increases, the proportion of noise in a signal may decrease. For example, referring to a case where the width W_RA of the light sensing portion RA is 7 μm in FIG. 4, when the optical hole LH has the first width W1, a first noise ratio SNR1 may be obtained. In addition, when the width W_RA of the light sensing portion RA is 7 μm and the optical hole LH has the second width W2, a second noise ratio SNR2 may be obtained. In addition, when the width W_RA of the light sensing portion RA is 7 μm and the optical hole LH has the third width W3, a third noise ratio SNR3 may be obtained. In this case, since the second width W2 is smaller than the first width W1, the second noise ratio SNR2 may be greater than the first noise ratio SNR1. In addition, since the third width W3 is smaller than the second width W2, the third noise ratio SNR3 may be greater than the second noise ratio SNR2. For example, the first noise ratio SNR1 may be 2:1, the second noise ratio SNR2 may be 2.5:1, and the third noise ratio SNR3 may be 3:1. In summary, as the width W_LH of the optical hole LH decreases, the signal-to-noise ratio may increase, and the accuracy of fingerprint sensing may increase.

In summary, as the width W_RA of the light sensing portion RA and the width W_LH of the optical hole LH decrease, the signal-to-noise ratio may increase, thereby increasing the accuracy of fingerprint sensing. In this case, however, the amount of light received by the photo sensor PS may decrease.

To increase the accuracy of fingerprint sensing and ensure that an adequate amount of light is received by the photo sensor PS, it is necessary to guarantee an appropriate width W_LH of the optical hole LH. For example, in the case where the width W_RA of the light sensing portion RA is 7 μm in FIG. 4, the length W_LR of the fingerprint sensing area LR incident on the light sensing portion LR may be 390 μm when the width W_LH of the optical hole LH has the second width W2. In this case, the second width W2 may be smaller than 15 μm and greater than 10 μm. Alternatively, the second width W2 may be 10 to 14 μm. In other words, when the width W_LH of the optical hole LH is 10 to 14 μm, the photo sensor PS may receive an adequate amount of light, and the accuracy of fingerprint sensing may be increased.

In the display device 1 according to the present embodiment, while the width W_RA of the light sensing portion RA and the width W_OP of the light blocking opening OP_P are maintained constant, the light blocking opening OP_P may be disposed adjacent to one side of the light sensing portion RA, and the optical hole LH may be disposed adjacent to another side of the light sensing portion RA. Accordingly, the ratio of light incident on the light sensing portion RA through the optical hole LH after being totally reflected by the fingerprint F may increase, thus securing the amount of light received. This feature can facilitate the implementation of a display device that offers both high fingerprint sensing accuracy and an increased amount of light received.

Figure 5:
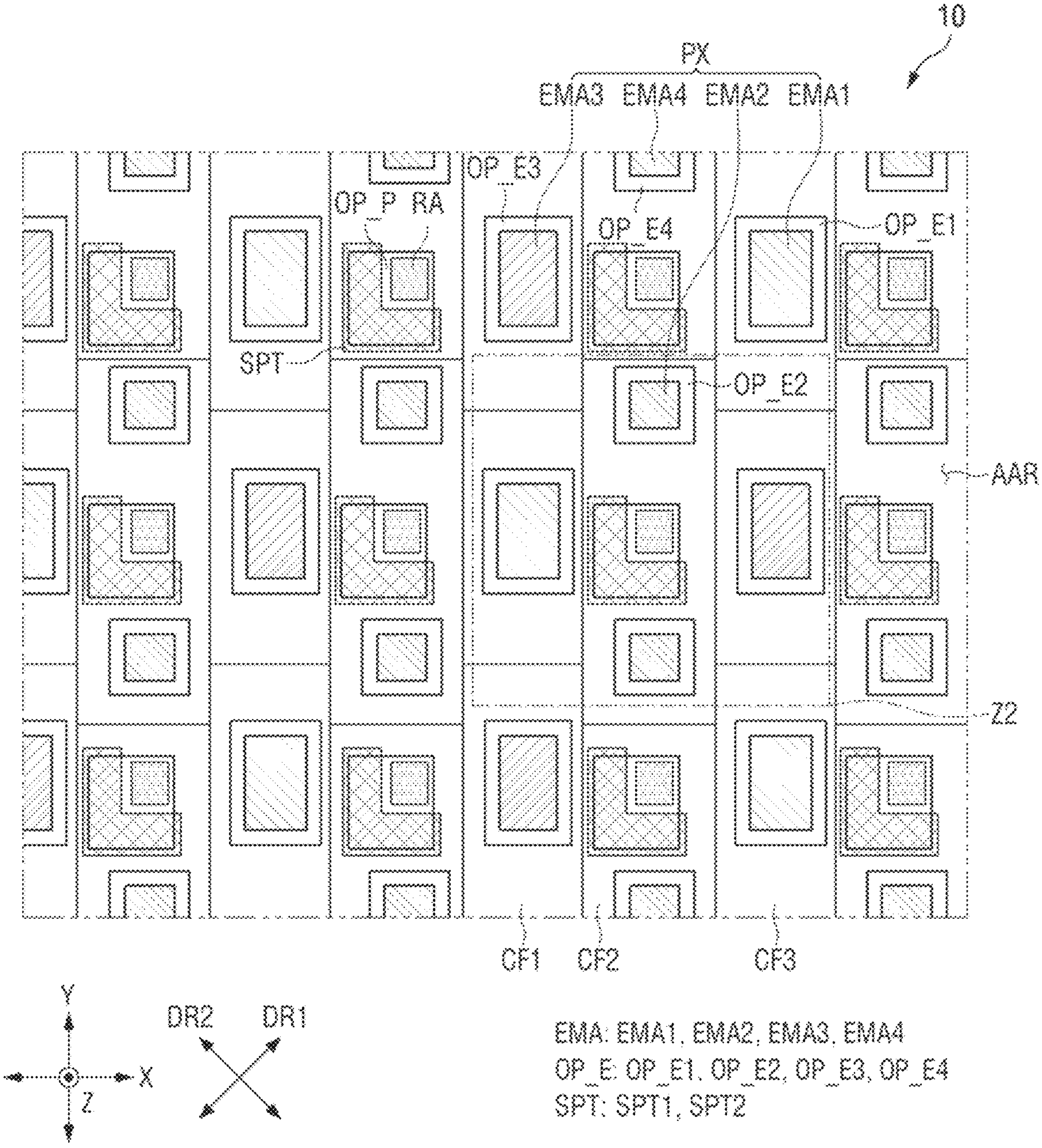
FIG. 5 is a plan layout view of pixels, photo sensors, and color filters of a display panel according to an embodiment of the present disclosure.
Figure 6:
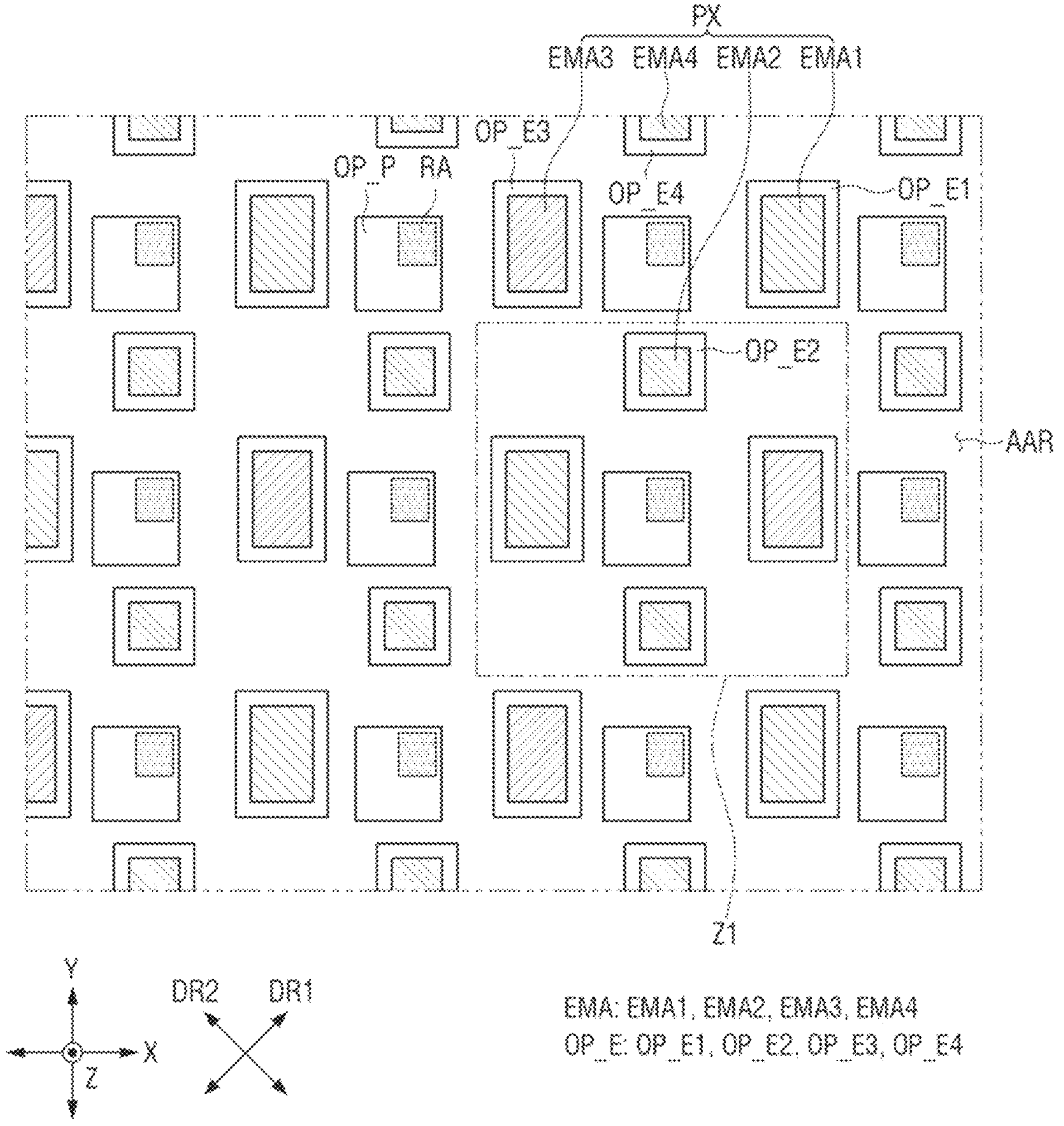
FIG. 6 is a plan layout view of the pixels and the photo sensors of the display panel according to the embodiment.
Figure 7:
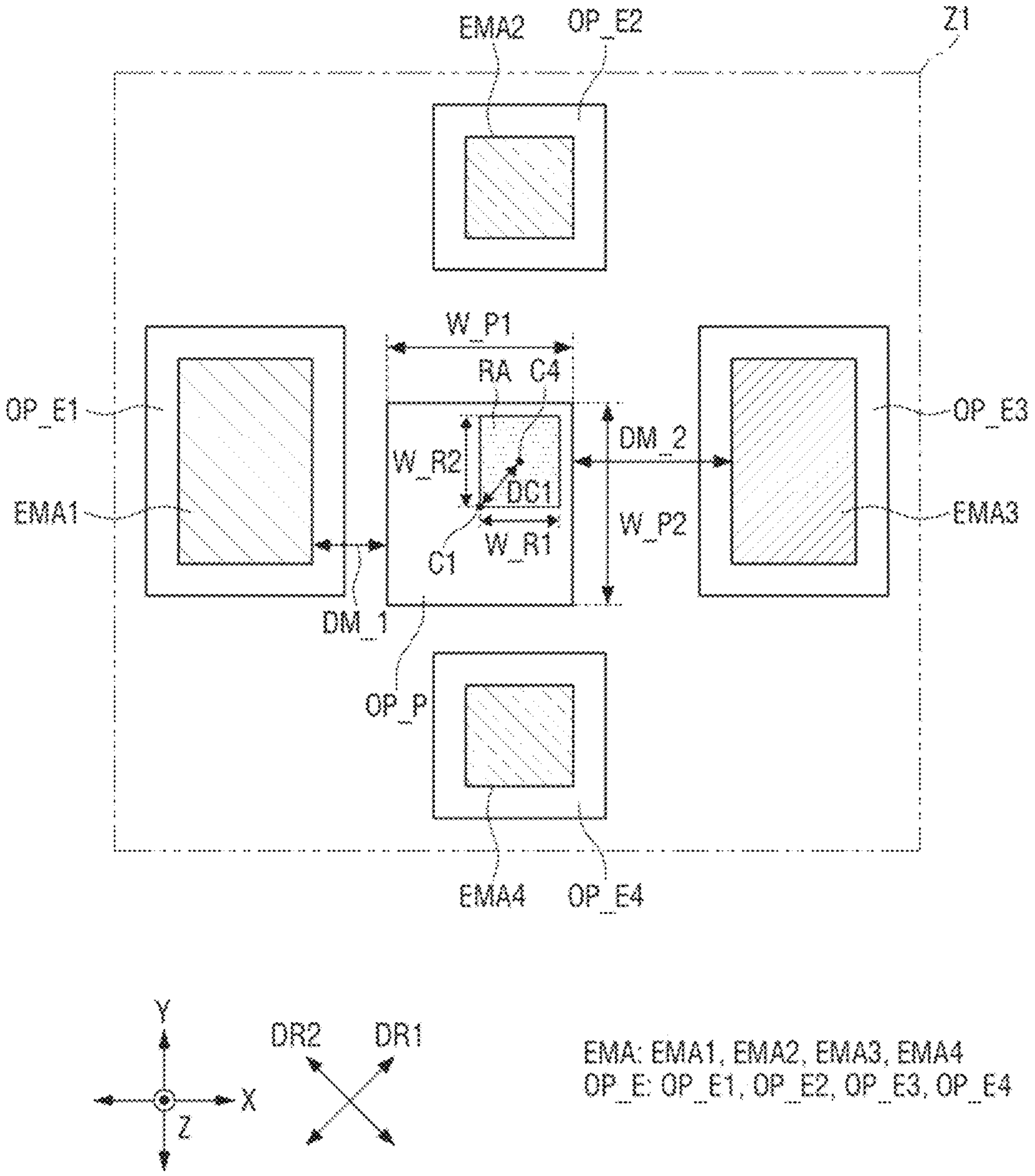
FIG. 7 is an enlarged plan view of area Z1 of FIG. 6.
Figure 8:
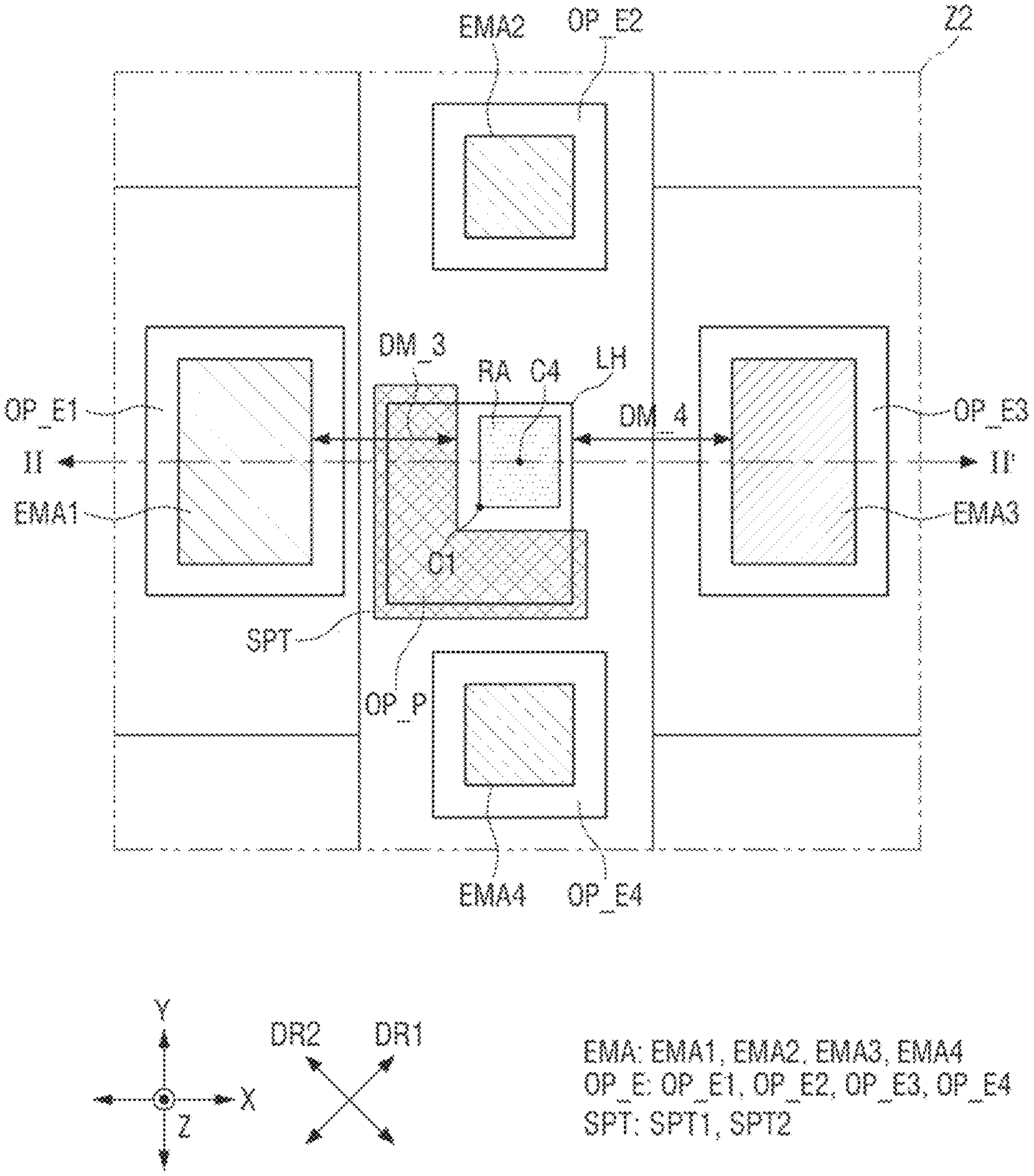
FIG. 8 is an enlarged plan view of area Z2 of FIG. 5.

FIG. 5 is a plan layout view of pixels PX, photo sensors PS, and color filters CF of a display panel 10 according to an embodiment. FIG. 6 is a plan layout view of the pixels PX and the photo sensors PS of the display panel 10 according to the embodiment. FIG. 7 is an enlarged plan view of area Z1 of FIG. 6. FIG. 8 is an enlarged plan view of area Z2 of FIG. 5.

Referring to FIGS. 5 through 8, each of a plurality of pixels PX included in the display panel 10 may include a plurality of light emitting portions EMA (EMA1 through EMA4) which emit light in the active area AAR. Each of the light emitting portions EMA may be an area in which a pixel electrode AE (see FIG. 9) is exposed by an opening of a bank layer 160 (see FIG. 9) in cross section and an area in which the exposed pixel electrode AE and a light emitting layer EML (see FIG. 9) overlap each other in a cross section.

In addition, a plurality of photo sensors PS may be disposed in the active area AAR of the pixels PX. The photo sensors PS may respectively include a plurality of light sensing portions RA which sense light in the active area AAR. Each of the light sensing portions RA may be an area in which a first electrode E1 (see FIG. 9) of a photo sensor PS is exposed by an opening of the bank layer 160 and an area in which the exposed first electrode E1 and a photoelectric conversion layer PEL (see FIG. 9) overlap each other.

A first light emitting portion EMA1 may emit light of a first color or red light, and a second light emitting portion EMA2 and a fourth light emitting portion EMA4 may emit light of a second color or green light. In addition, a third light emitting portion EMA3 may emit light of a third color or blue light. However, the present disclosure is not limited thereto.

Each of the pixels PX may include one first light emitting portion EMA1, one second light emitting portion EMA2, one third light emitting portion EMA3, and one fourth light emitting portion EMA4 to express a white gray level, but the configuration of each pixel PX is not limited thereto. One pixel PX may express a white gray level through a combination of light emitted from one first light emitting portion EMA1, one second light emitting portion EMA2, one third light emitting portion EMA3, and one fourth light emitting portion EMA4.

In an embodiment, the second light emitting portion EMA2 and the fourth light emitting portion EMA4 may be arranged in a first column along the second direction Y, and the first light emitting portion EMA1 and the third light emitting portion EMA3 may be alternately arranged along the second direction Y in a second column adjacent to the first column. The number of the second light emitting portions EMA2 and the fourth light emitting portions EMA4 in the first column may be twice the number of the first light emitting portions EMA1 or the third light emitting portions EMA3 in the second column. The arrangement of the first column and the second column may be repeated up to an $n^{th}$ column.

In addition, the third light emitting portion EMA3 and the first light emitting portion EMA1 may be alternately arranged in a first row along the first direction X, and the second light emitting portion EMA2 and the fourth light emitting portion EMA4 may be arranged at predetermined intervals along the first direction X in an adjacent second row. The first light emitting portion EMA1 and the third light emitting portion EMA3 may be alternately arranged in an adjacent third row, and the second light emitting portion EMA2 and the fourth light emitting portion EMA4 may be arranged at predetermined intervals along the first direction X in an adjacent fourth row. The arrangement of the light emitting portions EMA may be repeated up to an $n^{th}$ row.

The area of each light emitting portion EMA may be different. For example, the second light emitting portion EMA2 and the fourth light emitting portion EMA4 may be smaller than the first light emitting portion EMA1 and the third light emitting portion EMA3. Each light emitting portion EMA may be rectangular or square in plan view. However, the present disclosure is not limited thereto, and each light emitting portion EMA may have other polygonal shapes such as an octagon, a circle, or a rhombus.

When a plurality of photo sensors PS are disposed in a light sensing area overlapping the display area DA, each light sensing portion RA may be disposed between the second light emitting portion EMA2 and the fourth light emitting portion EMA4.

Each light sensing portion RA may neighbor the first to fourth light emitting portions EMA1 through EMA4. For example, each light sensing portion RA may be disposed between the second light emitting portion EMA2 and the fourth light emitting portion EMA4 neighboring each other in the second direction Y and may be disposed between the first light emitting portion EMA1 and the third light emitting portion EMA3 neighboring each other in the first direction X. For example, the second and fourth light emitting portions EMA2 and EMA4 and the light sensing portion RA may be alternately arranged along the second direction Y in a first column, and the first light emitting portion EMA1 and the third light emitting portion EMA3 may be alternately arranged along the second direction Y in a second column adjacent to the first column. In other words, the second and fourth light emitting portions EMA2 and EMA4 and the light sensing portion RA may be alternately arranged along the second direction Y in an odd-numbered column, and the first light emitting portion EMA1 and the third light emitting portion EMA3 may be alternately arranged along the second direction Y in an even-numbered column.

Each light sensing portion RA may absorb the second light of a green wavelength band emitted from an adjacent second or fourth light emitting portion EMA2 or EMA4 and convert the second light into an electrical signal, although the present disclosure is not limited thereto. On the other hand, each light sensing portion RA may recognize light of a red wavelength or light of a blue wavelength as a noise signal.

The color filters CF may be disposed on the light emitting portions EMA1 through EMA4. In addition, the color filters CF may include a first color filter CF1, a second color filter CF2, and a third color filter CF3.

The first color filter CF1 may be disposed on the blocking layer LS (see FIG. 9) in the first light emitting portion EMA1. The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant.

The second color filter CF2 may be disposed on the light blocking layer LS (see FIG. 9) in the second light emitting portion EMA2, the fourth light emitting portion EMA4, and the light sensing portion RA. The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant.

The third color filter CF3 may be disposed on the light blocking layer LS (see FIG. 9) in the third light emitting portion EMA3. The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant.

The color filters CF may absorb some of the light introduced from the outside of the display device 1 to reduce reflected light due to the external light. Therefore, the color filters CF may prevent color distortion due to reflection of the external light. 1001041 FIGS. 6 and 7 are plan views without the color filters CF and light blocking patterns SPT. The light sensing portions RA and the light blocking openings OP_P will be described in detail with reference to FIGS. 6 and 7.

Referring further to FIGS. 6 and 7, a light emitting opening OP_E overlapping each light emitting portion EMA may be provided on the light emitting portion EMA. The light emitting opening OP_E may overlap each light emitting portion EMA to allow light emitted from the light emitting portion EMA to pass therethrough in the third direction Z. For example, a first light emitting opening OP_E1 overlapping the first light emitting portion EMA1 may be provided on the first light emitting portion EMA1, and the first light emitting opening OP_E1 may allow light emitted from the first light emitting portion EMA1 to pass therethrough in the third direction Z. Descriptions of a second light emitting opening OP_E2, a third light emitting opening OP_E3, and a fourth light emitting opening OP_E4 are substantially the same as the description of the first light emitting opening OP_E1 and thus will be omitted. For example, a second light emitting opening OP_E2 overlapping the second light emitting portion EMA2 may be provided on the second light emitting portion EMA2, and the second light emitting opening OP_E2 may allow light emitted from the second light emitting portion EMA2 to pass therethrough in the third direction Z.

A width of each light emitting opening OP_E may be greater than a width of each light emitting portion EMA. For example, a first width of the first light emitting opening OP_E1 in the first direction X may be greater than a first width of the first light emitting portion EMA1 in the first direction X. In addition, a second width of the first light emitting opening OP_E1 in the second direction Y may be greater than a second width of the first light emitting portion EMA1 in the second direction Y. Accordingly, a portion of each light emitting opening OP_E may overlap a light emitting portion EMA, and the whole of each light emitting portion EMA may overlap a light emitting opening OP_E. Descriptions of widths of the second light emitting opening OP_E2, the third light emitting opening OP_E3, and the fourth light emitting opening OP_E4 are substantially the same as the description of the width of the first light emitting opening OP_E1 and thus will be omitted.

A light blocking opening OP_P overlapping each light sensing portion RA may be provided on the light sensing portion RA, and an optical hole LH overlapping the light blocking opening OP_P may be provided on the light blocking opening OP_P. The light blocking opening OP_P and the optical hole LH may overlap each light sensing portion RA to allow light, which is to be incident on the light sensing portion RA, to pass therethrough in the third direction Z.

A width of each light blocking opening OP_P may be greater than a width of each light sensing portion RA. For example, a first width W_P1 of each light blocking opening OP_P in the first direction X may be greater than a first width W_R1 of each light sensing portion RA in the first direction X. In addition, a second width W_P2 of each light blocking opening OP_P in the second direction Y may be greater than a second width W_R2 of each light sensing portion RA in the second direction Y. Accordingly, the whole of each light sensing portion RA may overlap a light blocking opening OP_P. In other words, the entirety of each light sensing portion RA may be exposed through a light blocking opening OP_P.

A light blocking opening OP_P may be disposed adjacent to one side of each light sensing portion RA. The one side may be, but is not limited to, one side in a first diagonal direction DR1 intersecting the first direction X and the second direction Y. The light blocking opening OP_P may be spaced apart from each light sensing portion RA by a first diagonal distance DC1 from a center C4 of the light sensing portion RA to a center C1 of the light blocking opening OP_P. Accordingly, at least a portion of the light blocking opening OP_P may overlap each light sensing portion RA, but at least another portion of the light blocking opening OP_P may overlap the bank layer 160. In other words, a first portion of the light blocking opening OP_P may overlap each light sensing portion RA and a second portion of the light blocking opening OP_P may not overlap each light sensing portion RA.

Accordingly, the light blocking opening OP_P may be disposed closer to the first light emitting portion EMA1 than to the third light emitting portion EMA3. In addition, the light blocking opening OP_P may be disposed closer to the fourth light emitting portion EMA4 than to the second light emitting portion EMA2. For example, when a minimum distance between the light blocking opening OP_P and the first light emitting portion EMA1 is a first minimum distance DM_1 and when a minimum distance between the light blocking opening OP_P and the third light emitting portion EMA3 is a second minimum distance DM_2, the first minimum distance DM_1 may be smaller than the second minimum distance DM_2. In addition, a minimum distance between the light blocking opening OP_P and the second light emitting portion EMA2 may be greater than a minimum distance between the light blocking opening OP_P and the fourth light emitting portion EMA4.

Referring further to FIG. 8, an optical hole LH may be formed on the light blocking opening OP_P by a light blocking pattern SPT on the one side of each light sensing portion RA. The light blocking pattern SPT may be disposed adjacent to the one side of the light blocking opening OP_P in the first diagonal direction DR1. Accordingly, a portion of the light blocking pattern SPT may overlap the light blocking opening OP_P, and another portion of the light blocking pattern SPT may not overlap the light blocking opening OP_P. In addition, all of the optical hole LH may overlap the light blocking opening OP_P, and a portion of the light blocking pattern SPT may not overlap the optical hole LH.

The light blocking pattern SPT may extend in the first direction X and protrude in the second direction Y. For example, the light blocking pattern SPT may extend in the first direction X to cover the light blocking opening OP_P and may protrude in the second direction Y to cover the light blocking opening OP_P. In other words, the light blocking pattern SPT may have a “L” shape. However, the present disclosure is not limited thereto, and the light blocking pattern SPT may also have various shapes overlapping the light blocking opening OP_P.

Accordingly, the optical hole LH may be disposed adjacent to one side of each light sensing portion RA. The one side may be one side in the first diagonal direction DR1 intersecting the first direction X and the second direction Y. In other words, the optical hole LH may be disposed on the other side of the light blocking opening OP_P disposed adjacent to the one side of each light sensing portion RA. Accordingly, at least a portion of the optical hole LH may overlap each light sensing portion RA, but at least another portion of the optical hole LH may overlap the bank layer 160. In other words, at least the another portion of the optical hole LH may not overlap each light sensing portion RA.

The optical hole LH may be disposed closer to the first light emitting portion EMA1 than to the third light emitting portion EMA3. In addition, the optical hole LH may be disposed closer to the fourth light emitting portion EMA4 than to the second light emitting portion EMA2. For example, when a minimum distance between the optical hole LH and the first light emitting portion EMA1 is a third minimum distance DM_3 and when a minimum distance between the optical hole LH and the third light emitting portion EMA3 is a fourth minimum distance DM_4, the third minimum distance DM_3 may be smaller than the fourth minimum distance DM_4. In addition, a minimum distance between the optical hole LH and the second light emitting portion EMA2 may be greater than a minimum distance between the optical hole LH and the fourth light emitting portion EMA4. The light sensing portions RA, the light blocking openings OP_P, and the optical holes LH will be described in detail later with reference to FIGS. 9 through 11.

In the current embodiment, in the display device 1, the optical hole LH is formed by placing the light blocking opening OP_P adjacent to one side of each light sensing portion RA and placing the light blocking pattern SPT on one side of the light blocking opening OP_P. Accordingly, the area of the optical hole LH can be reduced, which, in turn, increases the fingerprint sensing accuracy of the display device 1.

Figure 10:
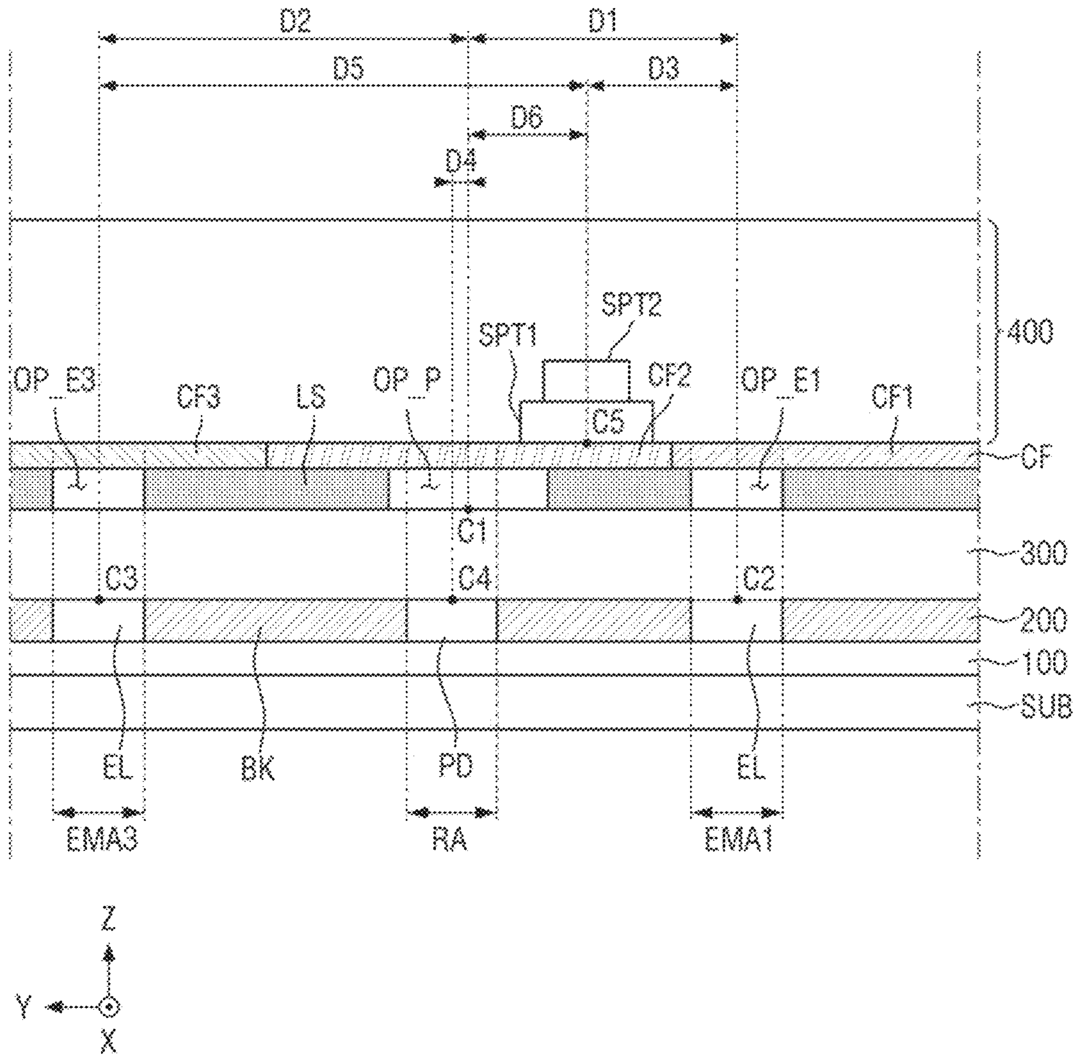
FIG. 10 is a schematic view illustrating a light sensing portion, a light blocking opening, and an optical hole of FIG. 9.
Figure 11:
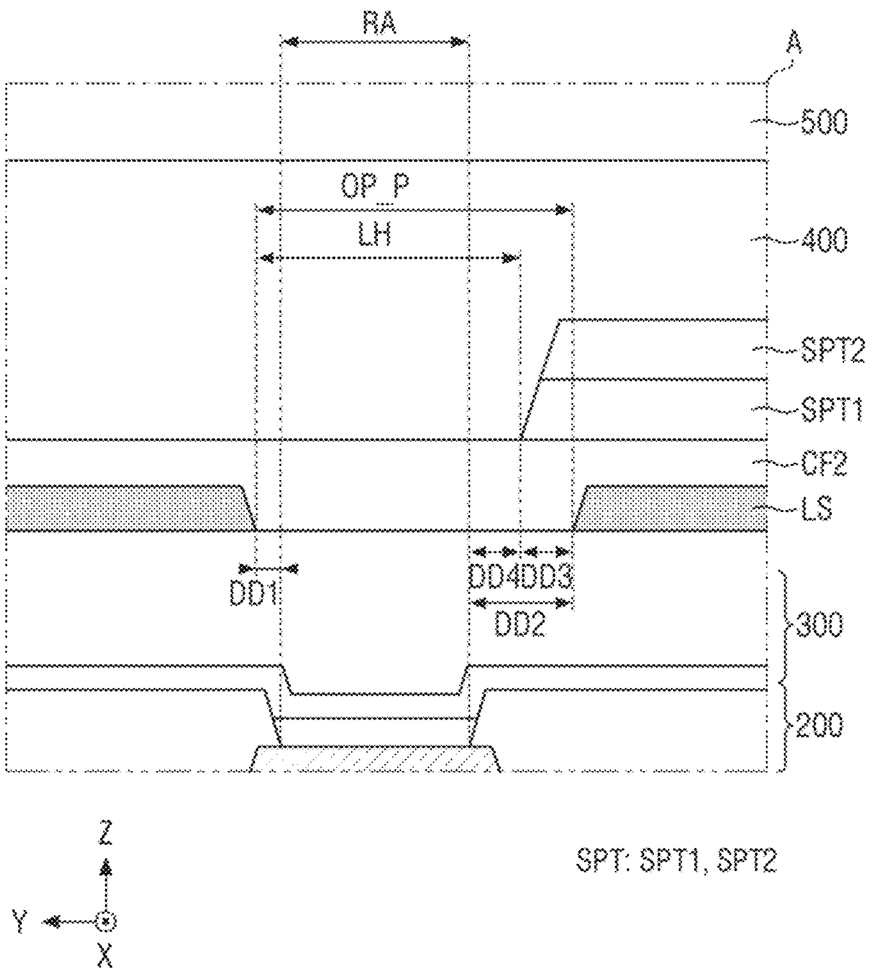
FIG. 11 is an enlarged view of area A of FIG. 9.
Figure 12:
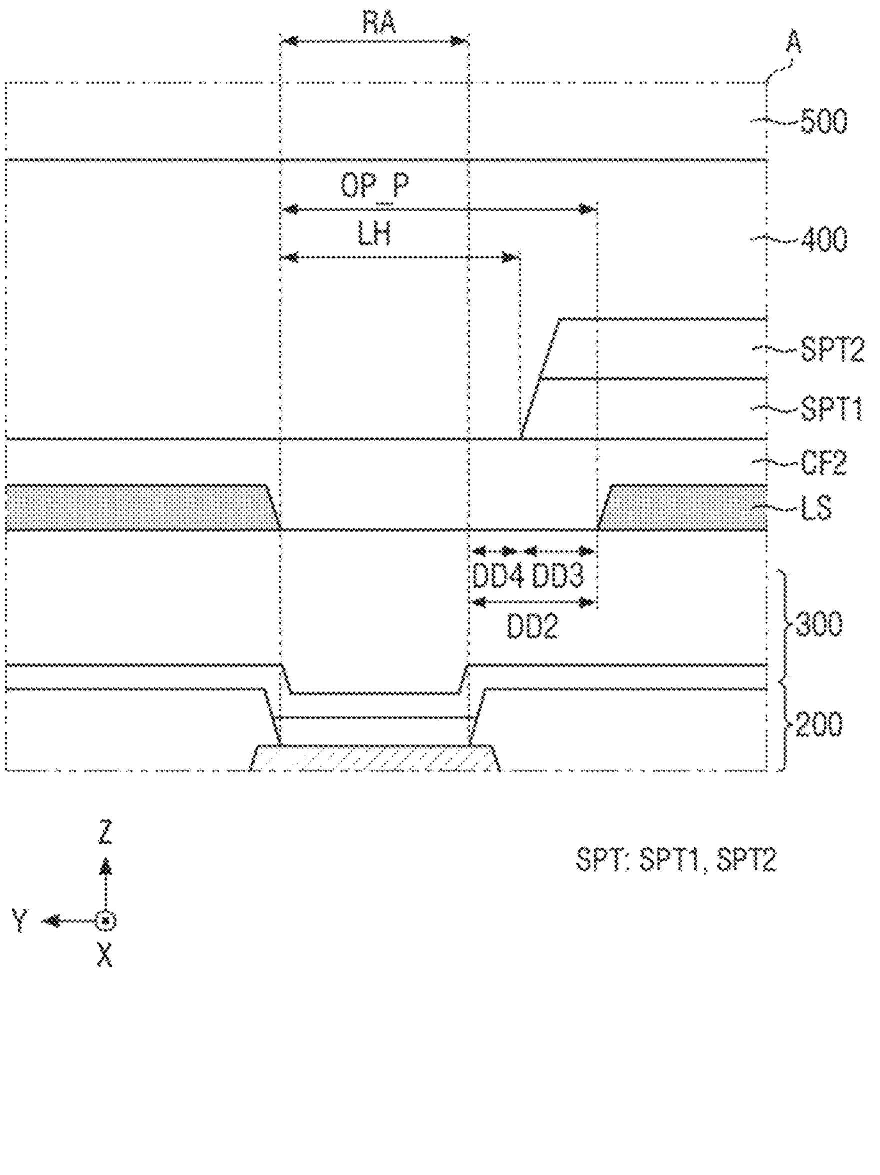
FIGS. 12 and 13 are cross-sectional views illustrating a light sensing portion, a light blocking opening, and an optical hole according to embodiments of the present disclosure.
Figure 13:
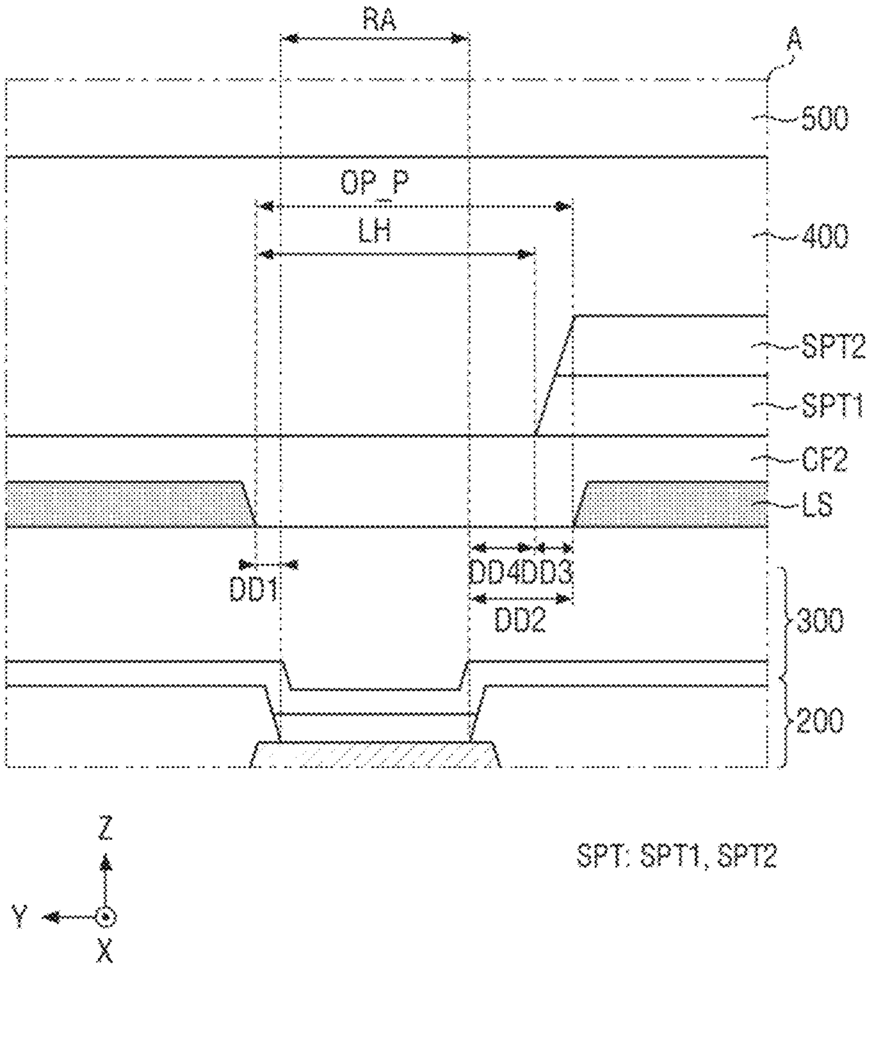

FIG. 9 is a cross-sectional view taken along line II-II' of FIG. 8. FIG. 10 is a schematic view illustrating a light sensing portion RA, a light blocking opening OP_P, and an optical hole LH of FIG. 9. FIG. 11 is an enlarged view of area A of FIG. 9. FIGS. 12 and 13 are cross-sectional views illustrating a light sensing portion RA, a light blocking opening OP_P, and an optical hole LH according to embodiments.

Detailed cross-sectional views of each pixel PX including the light emitting portions EMA and each photo sensor PS including the light sensing portion RA will now be described with reference to FIGS. 9 through 13.

Referring to FIG. 9, the display panel 10 may include a substrate SUB, a thin-film transistor layer 100 disposed on the substrate SUB, a light emitting element layer 200 disposed on the thin-film transistor layer 100, an encapsulation layer 300 disposed on the light emitting element layer 200, the light blocking layer LS disposed on the encapsulation layer 300, a planarization layer 400 covering the light blocking layer LS, and the cover window 500 disposed on the planarization layer 400.

The substrate SUB supports each layer disposed thereon. The substrate SUB may be made of an insulating material such as polymer resin. The polymer resin may be, for example, polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), or a combination thereof.

The thin-film transistor layer 100 may be disposed on the substrate SUB. The thin-film transistor layer 100 may include a first thin-film transistor TFT1, a second thin-film transistor TFT2, a first sensing transistor LT1 formed as a thin-film transistor, a buffer layer 110, a gate insulating layer 121, an interlayer insulating layer 122, and a planarization layer 130.

The buffer layer 110 is disposed on the substrate SUB. The buffer layer 110 may include silicon nitride (SiNx), silicon oxide (SiOx), or silicon oxynitride.

The first thin-film transistor TFT1, the second thin-film transistor TFT2, and the first sensing transistor LT1 formed as a thin-film transistor may be disposed on the buffer layer 110.

The thin-film transistors TFT1, TFT2 and LT1 may respectively include semiconductor layers A1, A2 and LA1, the gate insulating layer 121 disposed on portions of the semiconductor layers A1, A2 and LA1, gate electrodes G1, G2 and LG1 on the gate insulating layer 121, the interlayer insulating layer 122 covering the semiconductor layers A1, A2 and LA1 and the gate electrodes G1, G2 and LG1, and source electrodes S1, S2 and LS1 and drain electrodes D1, D2 and LD1 on the interlayer insulating layer 122.

The semiconductor layers A1, A2 and LA1 may respectively form channels of the first thin-film transistor TFT1, the second thin-film transistor TFT2, and the first sensing transistor LT1 formed as a thin-film transistor. The semiconductor layers A1, A2 and LA1 may include polycrystalline silicon. In an embodiment, the semiconductor layers A1, A2 and LA1 may include monocrystalline silicon, low-temperature polycrystalline silicon, amorphous silicon, or an oxide semiconductor. The oxide semiconductor may include, for example, a binary compound (ABx), a ternary compound (ABxCy) or a quaternary compound (ABxCyDz) containing indium, zinc, gallium, tin, titanium, aluminum, hafnium (Hf), zirconium (Zr), magnesium (Mg), etc. Each of the semiconductor layers A1, A2 and LA1 may include a channel region and a source region and a drain region doped with impurities.

The gate insulating layer 121 is disposed on the semiconductor layers A1, A2 and LA1. The gate insulating layer 121 electrically insulates a first gate electrode G1 from a first semiconductor layer A1, electrically insulates a second gate electrode G2 from a second semiconductor layer A2, and electrically insulates a first sensing gate electrode LG1 from a first sensing semiconductor layer LA1. The gate insulating layer 121 may be made of an insulating material such as silicon oxide (SiOx), silicon nitride (SiNx), or metal oxide.

The first gate electrode G1 of the first thin-film transistor TFT1, the second gate electrode G2 of the second thin-film transistor TFT2, and the first sensing gate electrode LG1 of the first sensing transistor LT1 are disposed on the gate insulating layer 121. The gate electrodes G1, G2 and LG1 may be formed above the channel regions of the semiconductor layers A1, A2 and LA1, in other words, may be formed on the gate insulating layer 121 at positions overlapping the channel regions, respectively.

The interlayer insulating layer 122 may be disposed on the gate electrodes G1, G2 and LG1. The interlayer insulating layer 122 may include an inorganic insulating material such as silicon oxide (SiOx), silicon nitride (SiNx), silicon oxynitride, hafnium oxide, or aluminum oxide. In addition, the interlayer insulating layer 122 may include a plurality of insulating layers and may further include a conductive layer between the insulating layers to form a capacitor second electrode.

The source electrodes S1, S2 and LS1 and the drain electrodes D1, D2 and LD1 are disposed on the interlayer insulating layer 122. A first source electrode S1 of the first thin-film transistor TFT1 may be electrically connected to the source region of the first semiconductor layer A1 through a contact hole penetrating the interlayer insulating layer 122 and the gate insulating layer 121. A second source electrode S2 of the second thin-film transistor TFT2 may be electrically connected to the source region of the second semiconductor layer A2 through a contact hole penetrating the interlayer insulating layer 122 and the gate insulating layer 121. A first sensing source electrode LS1 of the first sensing transistor LT1 may be electrically connected to the source region of the first sensing semiconductor layer LA1 through a contact hole penetrating the interlayer insulating layer 122 and the gate insulating layer 121. Likewise, first drain electrode D1 of the first thin-film transistor TFT1 may be electrically connected to the drain region of the first semiconductor layer A1 through a contact hole penetrating the interlayer insulating layer 122 and the gate insulating layer 121, and so forth. Each of the source electrodes S1, S2 and LS1 and the drain electrodes D1, D2 and LD1 may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The planarization layer 130 may be formed on the interlayer insulating layer 122 to cover each of the source electrodes S1, S2 and LS1 and the drain electrodes D1, D2 and LD1. The planarization layer 130 may be made of an organic insulating material. The planarization layer 130 may have a flat surface and may include a contact hole exposing any one of the source electrode S1, S2 or LS1 and the drain electrode D1, D2 or LD1.

The light emitting element layer 200 may be disposed on the planarization layer 130. The light emitting element layer 200 may include light emitting elements EL, a photoelectric converter PD, and the bank layer 160. Each of the light emitting elements EL may include a pixel electrode AE, a light emitting layer EML and a common electrode CE, and the photoelectric converter PD may include a first electrode E1, a photoelectric conversion layer PEL and the common electrode CE.

The pixel electrode AE of each light emitting element EL may be disposed on the planarization layer 130. The pixel electrode AE may be provided for each pixel PX. The pixel electrode AE may be connected to the first source electrode S1 or a first drain electrode D1 of the first thin-film transistor TFT1 through a contact hole penetrating the planarization layer 130 and may be connected to the second source electrode S2 or a second drain electrode D2 of the second thin-film transistor TFT2 through a contact hole penetrating the planarization layer 130.

The pixel electrode AE of each light emitting element EL may have, but is not limited to, a single layer structure of molybdenum (Mo), titanium (Ti), copper (Cu) or aluminum (Al) or a laminated layer structure, for example, a multilayer structure of ITO/Mg, ITO/MgF, ITO/Ag or ITO/Ag/ITO including indium tin oxide (ITO), indium zinc oxide (IZO), zinc oxide (ZnO) or indium oxide ($In_2O_3$) and silver (Ag), magnesium (Mg), aluminum (Al), platinum (Pt), lead (Pd), gold (Au) or nickel (Ni).

The first electrode E1 of the photoelectric converter PD may also be disposed on the planarization layer 130. The first electrode E1 may be provided for each photo sensor PS. The first electrode E1 may be connected to the first sensing source electrode LS1 or a first sensing drain electrode LD1 of the first sensing transistor LT1 through a contact hole penetrating the planarization layer 130.

The first electrode E1 of the photoelectric converter PD may have, but is not limited to, a single layer structure of molybdenum (Mo), titanium (Ti), copper (Cu) or aluminum (Al) or a multilayer structure of ITO/Mg, ITO/MgF, ITO/Ag or ITO/Ag/ITO.

The bank layer 160 may be disposed on the pixel electrode AE and the first electrode E1. The bank layer 160 may include an opening formed in each area overlapping the pixel electrode AE to expose the pixel electrode AE. A plurality of areas in which the exposed pixel electrode AE and the light emitting layer EML overlap each other may be referred to as a plurality of light emitting portions EMA including the first light emitting portion EMA1 and the third light emitting portion EMA3. In addition, the bank layer 160 may include an opening formed in an area overlapping the first electrode E1 to expose the first electrode E1. The opening exposing the first electrode E1 may provide a space in which the photoelectric conversion layer PEL of each photo sensor PS is formed, and an area in which the exposed first electrode E1 and the photoelectric conversion layer PEL overlap each other may be referred to as a light sensing portion RA.

The bank layer 160 may include an organic insulating material such as polyacrylate resin, epoxy resin, phenolic resin, polyamide resin, polyimide resin, unsaturated polyester resin, polyphenylenether resin, polyphenylenesulfide resin, or benzocyclobutene (BCB). In another example, the bank layer 160 may include an inorganic material such as silicon nitride.

The light emitting layer EML may be disposed on the pixel electrode AE of each light emitting element EL exposed by an opening of the bank layer 160. The light emitting layer EML may include a high molecular material or a low molecular material and may emit red, green or blue light in each pixel PX. Light emitted from the light emitting layer EML may contribute to image display or may function as a light source incident on a photo sensor PS.

When the light emitting layer EML is made of an organic material, a hole injecting layer and a hole transporting layer may be disposed under each light emitting layer EML, and an electron injecting layer and an electron transporting layer may be stacked on each light emitting layer EML. Each of the above layers may be a single layer or a multilayer including organic materials.

The first light emitting portion EMA1 of the light emitting element EL disposed on one side of the light sensing portion RA in the first direction X may emit first light, and the third light emitting portion EMA3 of the light emitting element EL disposed on the other side of the light sensing portion RA in the first direction X may emit second light. The first light may be a light source of a blue wavelength, and the second light may be a light source of a red wavelength. However, the present disclosure is not limited thereto.

The photoelectric conversion layer PEL may be disposed on the first electrode E1 of the photoelectric converter PD exposed by an opening of the bank layer 160. The photoelectric conversion layer PEL may generate photocharges in proportion to incident light. The incident light may be light entering the photoelectric conversion layer PEL after being emitted from the light emitting layer EML and then reflected or may be light provided from the outside without first passing through the light emitting layer EML. Charges generated and accumulated in the photoelectric conversion layer PEL may be converted into electrical signals required for sensing. When the photoelectric converter PD is exposed to external light, the photoelectric conversion layer PEL may generate photocharges in proportion to the amount of light to which the photoelectric converter PD is exposed.

The photoelectric conversion layer PEL may include an electron donor material and an electron acceptor material. The electron donor material may generate donor ions in response to light, and the electron acceptor material may generate acceptor ions in response to light. When the photoelectric conversion layer PEL is made of an organic material, the electron donor material may include, but is not limited to, a compound such as subphthalocyanine (SubPc) or dibutylphosphate (DBP). The electron acceptor material may include, but is not limited to, a compound such as fullerene, a fullerene derivative, or perylene diimide.

On the other hand, when the photoelectric conversion layer PEL is made of an inorganic material, the photoelectric converter PD may be a pn-type or pin-type phototransistor. For example, the photoelectric conversion layer PEL may have a structure in which an N-type semiconductor layer, an I-type semiconductor layer, and a P-type semiconductor layer are sequentially stacked.

When the photoelectric conversion layer PEL is made of an organic material, a hole injecting layer and a hole transporting layer may be disposed under each photoelectric conversion layer PEL, and an electron injecting layer and an electron transporting layer may be stacked on each photoelectric conversion layer PEL. Each of the above layers may be a single layer or a multilayer including organic materials.

The light sensing portion RA may be an area that receives light having the same wavelength as light emitted from the light emitting portion EMA of an adjacent light emitting element EL as a light source. In other words, the light sensing portion RA can receive light with a wavelength that matches the light emitted by the adjacent light emitting portion EMA.

In the present specification, areas in which the light emitting layer EML and the photoelectric conversion layer PEL are disposed are substantially the same as the light emitting portion EMA and the light sensing portion RA, respectively. However, the light emitting layer EML may also extend beyond the light emitting portion EMA to cover the bank layer 160, and the photoelectric conversion layer PEL may also extend beyond the light sensing portion RA to cover the bank layer 160.

The common electrode CE may be disposed on the light emitting layer EML, the photoelectric conversion layer PEL, and the bank layer 160. The common electrode CE may be disposed over a plurality of pixels PX and a plurality of photo sensors PS to cover the light emitting layers EML, the photoelectric conversion layers PEL, and the bank layer 160. The common electrode CE may include a conductive material having a low work function, such as Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg). Alternatively, the common electrode CE may include a transparent metal oxide such as indium tin oxide (ITO), indium zinc oxide (IZO), or zinc oxide (ZnO).

The photoelectric converter PD and each light emitting element EL may share the common electrode CE disposed on the photoelectric conversion layer PEL and the light emitting layer EML, although the present disclosure is not limited thereto.

The encapsulation layer 300 may be disposed on the light emitting element layer 200. The encapsulation layer 300 may include at least one inorganic layer to prevent penetration of oxygen or moisture into each of the light emitting layer EML and the photoelectric conversion layer PEL. In addition, the encapsulation layer 300 may include at least one organic layer to protect each of the light emitting layer EML and the photoelectric conversion layer PEL from foreign substances such as dust. For example, the encapsulation layer 300 may be formed in a structure in which a first inorganic layer, an organic layer, and a second inorganic layer are sequentially stacked. Each of the first inorganic layer and the second inorganic layer may be formed as a multilayer in which one or more inorganic layers selected from a silicon nitride layer, a silicon oxynitride layer, a silicon oxide layer, a titanium oxide layer, and an aluminum oxide layer are alternately stacked. The organic layer may be an organic layer such as acryl resin, epoxy resin, phenolic resin, polyamide resin, or polyimide resin.

The light blocking layer LS may be disposed on the encapsulation layer 300. As another example, when a touch layer is further disposed on the encapsulation layer 300, the light blocking layer LS may be disposed between the encapsulation layer 300 and the touch layer or may be disposed on the touch layer. The position of the light blocking layer LS is not limited as long as the light blocking layer LS is disposed on the encapsulation layer 300.

The light blocking layer LS may use a material that blocks light emitted from the light emitting elements EL. The light blocking layer LS may form a black matrix by using a material that absorbs visible light, for example, a metal material or by using a resin material that includes a pigment (e.g., carbon black) or dye. In another example, the light blocking layer LS may have a stacked structure of a red color filter, a green color filter, and a blue color filter. Accordingly, the light blocking layer LS may prevent color mixing between the pixels PX.

As described above, the light blocking layer LS may have a plurality of light emitting openings OP_E and a plurality of light blocking openings OP_P through which light passes. The third light emitting opening OP_E3 may overlap the third light emitting portion EMA3 to allow light emitted from the light emitting element EL of the third light emitting portion EMA3 in the third direction Z to pass therethrough. The first light emitting opening OP_E1 may overlap the first light emitting portion EMA1 to allow light emitted from the light emitting element EL of the first light emitting portion EMA1 in the third direction Z to pass therethrough. In addition, each of the light blocking openings OP_P may overlap the light sensing portion RA to allow light, which is to be incident on the photoelectric converter PD in a direction opposite to the third direction Z, to pass therethrough.

Referring further to FIG. 10, a portion of a light blocking opening OP_P may overlap a light sensing portion RA. For example, at least a portion of the light blocking opening OP_P may overlap each light sensing portion RA, but at least another portion of the light blocking opening OP_P may overlap the bank layer 160. In other words, at least another portion of the light blocking opening OP_P may not overlap each light sensing portion RA.

The light blocking opening OP_P may be disposed closer to the first light emitting portion EMA1 than to the third light emitting portion EMA3. For example, when a distance between a first center C1 of the light blocking opening OP_P and a second center C2 of the first light emitting portion EMA1 in a cross section is a first distance D1 and when a distance between the first center C1 of the light blocking opening OP_P and a third center C3 of the third light emitting portion EMA3 in a cross section is a second distance D2, the first distance D1 may be smaller than the second distance D2. In addition, the light blocking opening OP_P may be disposed closer to the first light emitting opening OP_E1 than to the third light emitting opening OP_E3.

In other words, the light blocking opening OP_P may be disposed adjacent to one side of the light sensing portion RA. For example, the light blocking opening OP_P may be disposed adjacent to the first light emitting portion EMA1 in the first direction (X-axis direction) of the light sensing portion RA. In addition, when a distance between the first center C1 of the light blocking opening OP_P and a fourth center C4 of the light sensing portion RA in a cross section is a fourth distance D4, the light blocking opening OP_P may be spaced apart from the light sensing portion RA by the fourth distance D4 in the direction of the first light emitting portion EMA1. Therefore, the fourth distance D4 may be half the difference between the first distance D1 and the second distance D2. Alternatively, the fourth distance D4 may be 1/7 to 4/7 times the width of the light sensing portion RA. Alternatively, when the width of the light sensing portion RA is 6 to 8 μm, the fourth distance D4 may be 1 to 4 μm.

The light blocking layer LS may be covered by the color filters CF. The color filters CF may selectively transmit, absorb, or block light. Each of the color filters CF may be a resin material including a dye or a pigment. The color filters CF may include a plurality of multilayer structures selected from dielectrics such as SiO2, TiO2, ZrO2, Ta2O5, HfO2, Al2O3, ZnO, Y2O3, BeO, MgO, PbO2, WO3, VOX, SiNX, eNX, AlN, ZnS, CdS, SiC, SiCN, MgF, CaF2, NaF, BaF2, PbF2, LiF, LaF3, GaP, and AlOx.

The color filters CF may correspond to the light sensing portion RA, the third light emitting portion EMA3, and the first light emitting portion EMA1. In addition, the color filters CF may cover a portion of an upper surface of the light blocking layer LS. For example, the color filters CF may be disposed on the encapsulation layer 300 in areas of the light sensing portion RA, the third light emitting portion EMA3 and the first light emitting portion EMA1 and may be disposed on the light blocking layer LS in other areas.

The color filters CF may include the first color filter CF1, the second color filter CF2, and the third color filter CF3.

The first color filter CF1 may be disposed on the light blocking layer LS in the first light emitting portion EMA1. The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant.

The second color filter CF2 may be disposed on the light blocking layer LS in the second light emitting portion EMA2, the fourth light emitting portion EMA4, and the light sensing portion RA. The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant. Therefore, the second color filter CF2 may absorb or block the first light and the third light to prevent the reflected light from being seen from the outside.

The third color filter CF3 may be disposed on the light blocking layer LS in the third light emitting portion EMA3. The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant.

Light blocking patterns SPT may be disposed on the color filters CF. The light blocking patterns SPT may include a first light blocking pattern SPT1 and a second light blocking pattern SPT2. The first light blocking pattern SPT1 may be disposed on the second color filter CF2, and the second light blocking pattern SPT2 may be disposed on the first light blocking pattern SPT1.

The first light blocking pattern SPT1 and the second light blocking pattern SPT2 may overlap each other. The first light blocking pattern SPT1 and the second light blocking pattern SPT2 may be in direct contact with each other. The first light blocking pattern SPT1 and the second light blocking pattern SPT2 may overlap the light blocking opening OP_P. For example, a portion of the first light blocking pattern SPT1 and the second light blocking pattern SPT2 may overlap the light blocking opening OP_P, and another portion of the first light blocking pattern SPT1 and the second light blocking pattern SPT2 may overlap the light blocking layer LS. In other words, the first light blocking pattern SPT1 and the second light blocking pattern SPT2 may be sequentially disposed in the third direction Z to partially overlap the light blocking opening OP_P.

The light blocking patterns SPT may be made of the same material as the color filters CF. For example, the first light blocking pattern SPT1 may be made of the same material as the third color filter CF3, and the second light blocking pattern SPT2 may be made of the same material as the first color filter CF1. However, the present disclosure is not limited thereto, and the light blocking patterns SPT may further include a plurality of multilayer structures selected from dielectrics such as $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, VOX, SiNX, eNX, AlN, ZnS, CdS, SiC, SiCN, MgF, $CaF_2$, NaF, $BaF_2$, $PbF_2$, LiF, $LaF_3$, GaP, and AlOx.

The arrangement relationship of the first light blocking pattern SPT1 with the light sensing portion RA and the light blocking opening OP_P and the arrangement relationship of the second light blocking pattern SPT2 with the light sensing portion RA and the light blocking opening OP_P are substantially the same. Therefore, the arrangement relationship of a light blocking pattern SPT with the light sensing portion RA and the light blocking opening OP_P will be described below.

The light blocking pattern SPT may be disposed between the light blocking opening OP_P and the first light emitting portion EMA1. For example, when a distance between a fifth center C5 of the light blocking pattern SPT and the second center C2 of the first light emitting portion EMA1 in a cross section is a third distance D3 and when a distance between the fifth center C5 of the light blocking pattern SPT and the third center C3 of the third light emitting portion EMA3 in a cross section is a fifth distance D5, the fifth distance D5 may be greater than the third distance D3. In addition, since the light blocking pattern SPT is disposed between the light blocking opening OP_P and the first light emitting portion EMA1, the third distance D3 may be smaller than the first distance D1, and the fifth distance D5 may be greater than the second distance D2. In other words, the light blocking pattern SPT may be disposed closer to the first light emitting portion EMA1 than to the third light emitting portion EMA3.

Accordingly, in a cross section, a center of the light blocking pattern SPT may be spaced apart from a center of the light blocking opening OP_P so that the light blocking pattern SPT is adjacent to the first light emitting portion EMA1. For example, when a distance between the fifth center C5 of the light blocking pattern SPT and the first center C1 of the light blocking opening OP_P in a cross section is a sixth distance D6, the sixth distance D6 may be smaller than the first distance D1. In addition, the sixth distance D6 may be equal to a difference between the fifth distance D5 and the second distance D2 and may be equal to a difference between the first distance D1 and the third distance D3. Therefore, the center of the light blocking pattern SPT may be spaced apart from the center of the light blocking opening OP_P by the sixth distance D6. In other words, a portion of the light blocking pattern SPT may overlap the light blocking opening OP_P, and another portion of the light blocking pattern SPT may overlap the light blocking layer LS. For example, a first part of the light blocking pattern SPT may overlap the light blocking opening OP_P, and a second part of the light blocking pattern SPT may overlap the light blocking layer LS.

Accordingly, an optical hole LH may be formed by the light blocking pattern SPT and the light blocking opening OP_P of the light blocking layer LS. In other words, the optical hole LH may overlap the light sensing portion RA to allow light, which is to be incident on the photoelectric converter PD in the direction opposite to the third direction Z, to pass therethrough. In addition, the optical hole LH may overlap each light blocking opening OP_P to allow light, which is to be incident on the light sensing portion RA, to pass therethrough.

Referring further to FIG. 11, the light sensing portion RA may overlap the light blocking opening OP_P. For example, a first portion of the light blocking opening OP_P may overlap the light sensing portion RA, and a second portion of the light blocking opening OP_P may not overlap the light sensing portion RA. In other words, the second portion of the light blocking opening OP_P may overlap the bank layer 160.

Accordingly, a width of the light blocking opening OP_P may be greater than a width of the light sensing portion RA. For example, in the cross-sectional view of FIG. 11, a first edge of the light blocking opening OP_P may be spaced apart from a first edge of the light sensing portion RA by a first separation distance DD1. In addition, a second edge of the light blocking opening OP_P may be spaced apart from a second edge of the light sensing portion RA by a second separation distance DD2. In this case, the width of the light blocking opening OP_P may be 10/7 to 15/7 times the width of the light sensing portion RA. Alternatively, when the width of the light sensing portion RA is 6 to 8 μm, the width of the light blocking opening OP_P may be 14 to 16 μm. In addition, the first separation distance DD1 may be smaller than the width of the light sensing portion RA and smaller than the second separation distance DD2. However, the present disclosure is not limited thereto, and the first separation distance DD1 may also be nonexistent as in the embodiment of FIG. 12. In other words, one side of the light sensing portion RA and one side of the light blocking opening OP_P may be aligned with each other in the first direction X.

A first portion of the light blocking pattern SPT may overlap the light blocking opening OP_P. For example, the first portion of the light blocking pattern SPT may overlap the light blocking opening OP_P, and a second portion of the light blocking pattern SPT may overlap the light blocking layer LS. Accordingly, an area (or length) in which the light blocking opening OP_P and the light blocking pattern SPT do not overlap each other may be the optical hole LH.

Accordingly, the optical hole LH may overlap the light blocking opening OP_P and may not overlap the light blocking pattern SPT. In addition, a width of the optical hole LH may be smaller than the width of the light blocking opening OP_P. In the cross-sectional view of FIG. 11, a first edge of the optical hole LH may be adjacent to a first edge of the light blocking opening OP_P. In addition, a second edge of the optical hole LH may be spaced apart from a second edge of the light blocking opening OP_P by a third separation distance DD3. In other words, the light blocking pattern SPT may overlap the light blocking opening OP_P by the third separation distance DD3, and the optical hole LH may not overlap the light blocking opening OP_P by the third separation distance DD3. In this case, the third separation distance DD3 may be 1/7 to 5/7 times the width of the light sensing portion RA. Alternatively, the third separation distance DD3 may be 1 to 5 μm.

The light sensing portion RA may overlap the optical hole LH. For example, a first portion of the optical hole LH may overlap the light sensing portion RA, and a second portion of the optical hole LH may not overlap the light sensing portion RA. In other words, the second portion of the optical hole LH may overlap the bank layer 160.

Therefore, the width of the optical hole LH may be greater than the width of the light sensing portion RA. For example, in the cross-sectional view of FIG. 11, a first edge of the optical hole LH may be spaced apart from a first edge of the light sensing portion RA by the first separation distance DD1. In addition, a second edge of the optical hole LH may be spaced apart from a second edge of the light sensing portion RA by a fourth separation distance DD4. In this case, the width of the optical hole LH may be 10/7 to 2 times the width of the light sensing portion RA. Alternatively, when the width of the light sensing portion RA is 6 to 8 μm, the width of the optical hole LH may be 10 to 14 μm. However, the present disclosure is not limited thereto, and the first separation distance DD1 may also be nonexistent as in the embodiment of FIG. 12. For example, one side of the light sensing portion RA and one side of the light blocking opening OP_P may be aligned with each other in the first direction X. Even in this case, the light blocking pattern SPT may overlap the light blocking opening OP_P by the third separation distance DD3. Alternatively, as in the embodiment of FIG. 13, when the first separation distance DD1 exists, the fourth separation distance DD4 may be greater than the third separation distance DD3. In the current embodiment, since the light blocking pattern SPT is disposed on the second side of the light blocking opening OP_P, the width of the optical hole LH may be smaller than the width of the light blocking opening OP_P and may be greater than the width of the light sensing portion RA.

Referring back to FIG. 9, the light blocking layer LS may be covered by the planarization layer 400. The planarization layer 400 may be a material having excellent light transmittance. The planarization layer 400 may planarize the top of the light blocking layer LS. The planarization layer 400 may include, but is not limited to, an organic material.

The cover window 500 may be disposed on the planarization layer 400. The cover window 500 may be a protective member disposed on the planarization layer 400 to protect the elements of the display device 1. The cover window 500 may be glass or plastic. When the cover member includes glass, it may be applied as ultra-thin glass (UTG) having a thickness of 0.1 mm or less to have flexible properties. In addition, a polarizing plate may be disposed between the cover window 500 and the planarization layer 400.

Figure 14:
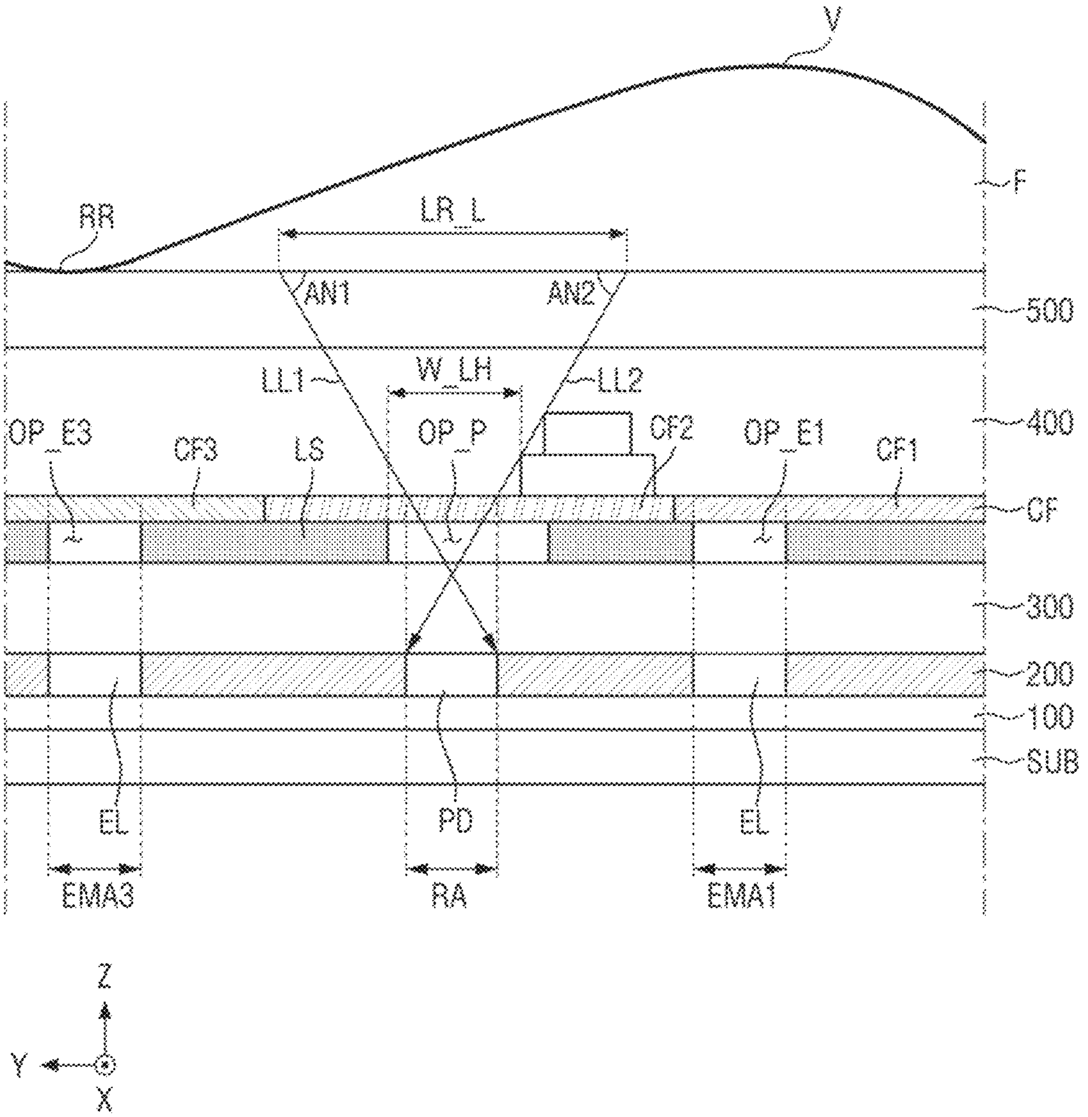
FIG. 14 illustrates an example of the region of light incident on a light sensing portion of the display device according to the embodiment.
Figure 15:
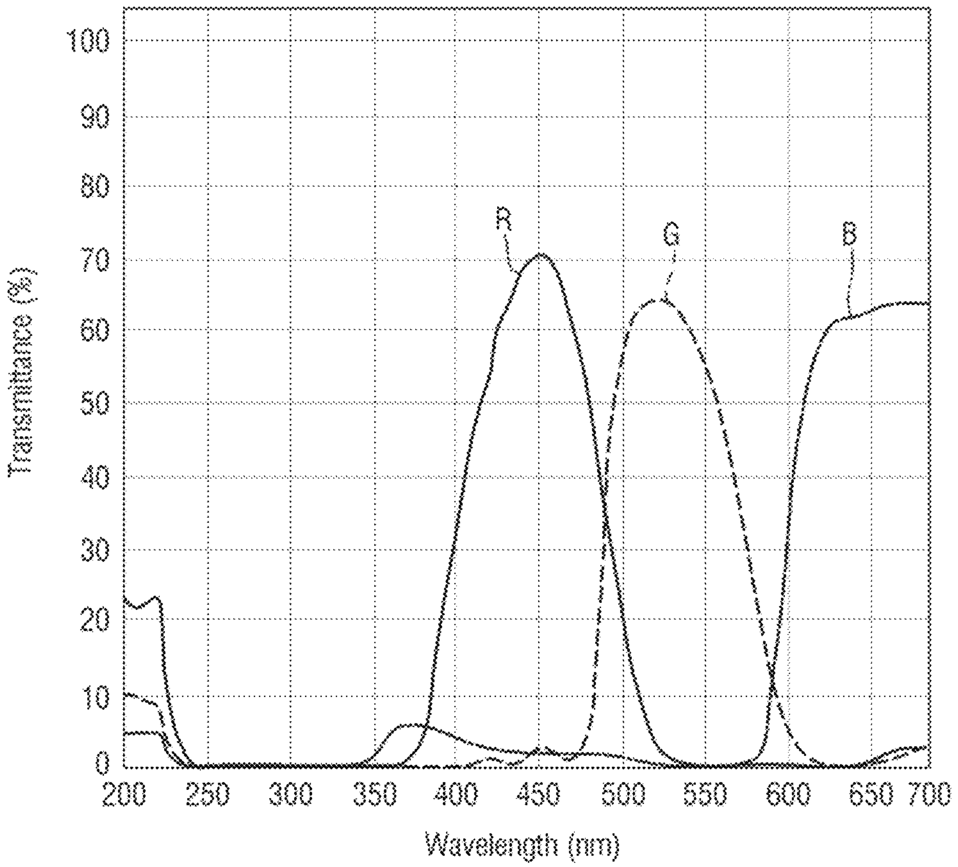
FIG. 15 is a graph illustrating light transmittances of color filters.

FIG. 14 illustrates an example of the region of light incident on a light sensing portion RA of the display device 1 according to the embodiment. FIG. 15 is a graph illustrating light transmittances of color filters.

Referring to FIG. 14, a fingerprint F of a finger consists of ridges RR having a specific pattern and valleys V between the ridges RR. When the fingerprint F is in contact with the upper surface of the cover window 500, the ridges RR of the fingerprint F are in contact with the upper surface of the cover window 500, but the valleys V of the fingerprint F are not in contact with the upper surface of the cover window 500. In other words, the upper surface of the cover window 500 contacts air in the valleys V.

When the fingerprint F is in contact with the upper surface of the cover window 500, light output from the light emitting elements EL may be reflected by the ridges RR and the valleys V of the fingerprint F. Here, since a refractive index of the fingerprint F and a refractive index of air are different, the amount of light reflected by the ridges RR of the fingerprint F and the amount of light reflected by the valleys V may be different. Accordingly, the ridges RR and the valleys V of the fingerprint F may be detected based on a difference in the amount of reflected light, in other words, a difference in the amount of light incident on a photoelectric converter PD. Since the photoelectric converter PD outputs an electrical signal according to the difference in the amount of light, a fingerprint pattern of the finger can be identified.

In this case, a length LR_L of the region (or area) LR of light incident on the light sensing portion RA in one direction may be smaller than a distance between the ridges RR and the valleys V of the fingerprint F. The one direction may be, but is not limited to, the first direction X or the second direction Y.

Light emitted from the light emitting elements EL may pass through the cover window 500 and exit to the outside through the upper surface of the cover window 500.

At least a portion of the light emitted from the light emitting elements EL has first reflected light LL1 toward the photoelectric converter PD. At least a portion of the light emitted from the light emitting elements EL is reflected at an interface between the upper surface of the cover window 500 and air or at an interface between the upper surface of the cover window 500 and the ridges RR of the fingerprint F, and the first reflected light LL1 travels toward the photoelectric converter PD. In this case, the first reflected light LL1 may have a reflection angle AN1 or AN2. The reflection angle AN1 or AN2 is equal to an angle at which light emitted from the light emitting elements EL is incident on the above interface, in other words, an angle formed by the upper surface of the cover window 500 and incident light.

In FIG. 14, a first reflection angle AN1 and a second reflection angle AN2 are maximum reflection angles in the region (or area) LR of light incident on the light sensing portion RA. Light emitted from the light emitting elements EL may be totally reflected at the interface of the cover window 500. The first reflected light LL1 having the first reflection angle AN1 may be incident on the light sensing portion RA. In addition, the light emitted from the light emitting elements EL may be totally reflected at the interface of the cover window 500. Of the light, second reflected light LL2 having the second reflection angle AN2 may be incident on the light sensing portion RA.

In this case, the length LR_L of the region (or area) LR of the light incident on the light sensing portion RA in one direction may be determined by the first reflected light LL1 reflected at the first reflection angle AN1 and the second reflected light LL2 reflected at the second reflection angle AN2.

Referring further to FIG. 15, the first light blocking pattern SPT1 may be made of the same material as a red color filter R, and the second light blocking pattern SPT2 may be made of the same material as a blue color filter B. For example, when the second color filter CF2 is made of a green color filter G, the first color filter CF1 may be made of the red color filter R, and the first light blocking pattern SPT1 may also be made of the red color filter R. The first light blocking pattern SPT1 may selectively transmit red light and block or absorb green light and blue light. In addition, the third color filter CF3 may be made of the blue color filter B, and the second light blocking pattern SPT2 may also be made of the blue color filter B. The second light blocking pattern SPT2 may selectively transmit blue light and block or absorb red light and green light.

Accordingly, reflected light having a smaller reflection angle than the second reflected light LL2 may be blocked by the light blocking patterns SPT. For example, when the first light blocking pattern SPT1 is made of the red color filter R and the second light blocking pattern SPT2 is made of the blue color filter B, reflected light having a smaller reflection angle than the second reflected light LL2 must pass through the light blocking patterns SPT to proceed to an optical hole LH. In this case, a red light component and a blue light component of the reflected light having a smaller reflection angle than the second reflected light LL2 may be reflected or absorbed without passing through the light blocking patterns SPT. In addition, a green light component of the reflected light may be blocked or absorbed by the light blocking patterns SPT as the reflected light passes through the second color filter CF2. In other words, the reflected light having a smaller reflection angle than the second reflected light LL2 may not be incident on the light sensing portion RA. In addition, reflected light having a smaller reflection angle than the first reflected light LL1 may not be incident on the light sensing portion RA. For example, the reflected light having a smaller reflection angle than the first reflected light LL1 may be reflected or absorbed without passing through the light blocking layer LS.

In the display device 1 according to the embodiments, a center of a light blocking opening OP_P is disposed adjacent to one side of the light sensing portion RA, and the light blocking patterns SPT are disposed adjacent to the one side of the light sensing portion RA. Therefore, the fingerprint sensing area LR incident on the light sensing portion RA may be adjusted through the light blocking patterns SPT. Accordingly, the area of the optical hole LH can be reduced, and the fingerprint sensing accuracy of the display device 1 can be increased.

Figure 16:
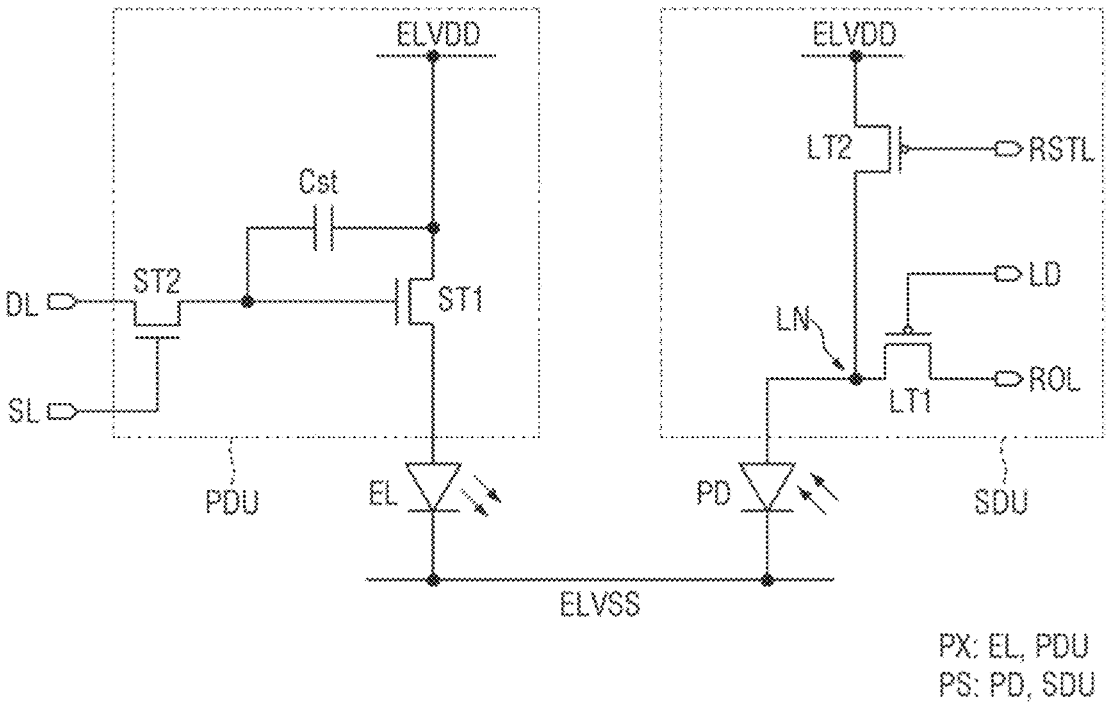
FIG. 16 is a circuit diagram of a pixel and a light sensing portion of the display device according to the embodiment.

FIG. 16 is a circuit diagram of a pixel PX and a light sensing portion RA of the display device 1 according to the embodiment.

Referring to FIG. 16, the display panel 10 may include a display circuit unit PDU for controlling the amount of light emitted from each of a plurality of pixels PX. The panel driving circuit 20 may apply a driving signal or a driving voltage to one or more transistors and various signal lines included in the display circuit unit PDU corresponding to each of the pixels PX.

The display panel 10 may also include a monitoring circuit unit SDU for controlling the amount of light received by each of a plurality of photo sensors PS. The panel driving circuit 20 may apply a driving signal or a driving voltage to one or more transistors and various signal lines included in the monitoring circuit unit SDU corresponding to each of the photo sensors PS and may receive light incident from each of the photo sensors PS as a sensing signal which is an electrical signal.

The display circuit unit PDU and the monitoring circuit unit SDU may each be formed as an integrated circuit or may be integrated into one integrated circuit as illustrated in FIG. 16.

The display circuit unit PDU may include a light emitting element EL, a capacitor Cst, a first transistor ST1, and a second transistor ST2. The display circuit unit PDU may receive a data signal DATA, a first scan signal, a first power supply voltage ELVDD (also referred to as a driving voltage), and a second power supply voltage ELVSS (also referred to as a common voltage). The data signal DATA may be provided through the data driver 22 connected to a data wiring DL, and the first scan signal may be provided through the scan driver 23 connected to a scan wiring SL.

The light emitting element EL may be an organic light emitting diode including an anode, a cathode, and a light emitting layer EML disposed between the anode and the cathode. The anode of the light emitting element EL is connected to the first transistor ST1. The cathode of the light emitting element EL is connected to a second power supply voltage terminal to receive the second power supply voltage ELVSS.

The capacitor Cst is connected between a gate electrode of the first transistor ST1 and a first power supply voltage terminal to receive the first power supply voltage ELVDD. The capacitor Cst includes a capacitor first electrode connected to the gate electrode of the first transistor ST1 and a capacitor second electrode connected to the first power supply voltage terminal.

The first transistor ST1 may be a driving transistor, and the second transistor ST2 may be a switching transistor.

Each of the driving and switching transistor may include a gate electrode, a source electrode, and a drain electrode. Any one of the source electrode and the drain electrode may be a first electrode, and the other may be a second electrode. For ease of description, a case where the drain electrode is the first electrode and the source electrode is the second electrode will be described below as an example.

As a diving transistor, the first transistor ST1 may generate a driving current. The first transistor ST1 has a gate electrode connected to the capacitor first electrode, a first electrode connected to the first power supply voltage terminal, and a second electrode connected to the anode of the light emitting element EL. The capacitor second electrode is connected to the first electrode of the first transistor ST1. In a cross-sectional view, the first transistor ST1 may be disposed on the thin-film transistor layer 100 (see FIG. 9).

As a switching transistor, the second transistor ST2 has a gate electrode connected to a first scan signal terminal, a first electrode connected to a data signal terminal, and a second electrode connected to the first electrode of the first transistor ST1. The second transistor ST2 may be turned on according to the first scan signal to perform a switching operation for transmitting the data signal DATA to the first electrode of the first transistor ST1. The second transistor ST2 may be disposed on the thin-film transistor layer 100.

The capacitor Cst may be charged with a voltage corresponding to the data signal DATA received from the second transistor ST2. The first transistor ST1 may control a driving current flowing through the light emitting element EL according to the amount of charge stored in the capacitor Cst.

However, this is only an example, and the display circuit unit PDU may also be structured to further include a compensation circuit that compensates for a threshold voltage deviation ΔVth of the first transistor ST1.

The monitoring circuit unit SDU may include a sensing transistor LT1, a reset transistor LT2, and a photoelectric converter PD. In addition, the monitoring circuit unit SDU may further include a sensing node LN between the sensing transistor LT1, the reset transistor LT2, and the photoelectric converter PD. The monitoring circuit unit SDU may receive a fingerprint scan signal, a fingerprint sensing signal, and a reset signal. The fingerprint scan signal may be provided through a fingerprint scan line LD, but the present disclosure is not limited thereto. The fingerprint sensing signal may be provided through the readout circuit 40 connected to a readout wiring ROL. The reset signal may be provided through a reset signal generator connected to a reset signal line RSTL.

The photoelectric converter PD may be an organic light emitting diode or a phototransistor including an anode, a cathode, and a photoelectric conversion layer PEL disposed between the anode and the cathode. The anode of the photoelectric converter PD is connected to the sensing node LN. The cathode of the photoelectric converter PD may be connected to the second power supply voltage terminal to receive the second power supply voltage ELVSS. The anode of the photoelectric converter PD may correspond to the first electrode E1 of FIG. 9, and the cathode may correspond to the common electrode CE of FIG. 9.

The photoelectric converter PD may generate photocharges when exposed to external light, and the generated photocharges may be accumulated in the anode of the photoelectric converter PD. In this case, the voltage of the sensing node LN electrically connected to the anode of the photoelectric converter PD may be increased. When the readout wiring ROL is connected to the photoelectric converter PD, a current may flow due to a difference between the voltage of the sensing node LN in which charges are accumulated and the voltage of the readout wiring ROL.

The sensing transistor LT1 may have a gate electrode connected to the fingerprint scan line LD, a first electrode connected to the sensing node LN, and a second electrode connected to the readout wiring ROL. The sensing transistor LT1 may be turned on according to the fingerprint scan signal and may transmit a current flowing through the photoelectric converter PD to the readout wiring ROL.

The reset transistor LT2 may have a gate electrode connected to the reset signal line RSTL, a first electrode connected to the first power supply voltage terminal, and a second electrode connected to the sensing node LN. In this case, the sensing node LN and the anode of the photoelectric converter PD may be reset to the first power supply voltage ELVDD.

Although a case where each transistor is an NMOS transistor is illustrated in FIG. 16, some or all of the transistors may also be provided as PMOS transistors.

Figure 17:
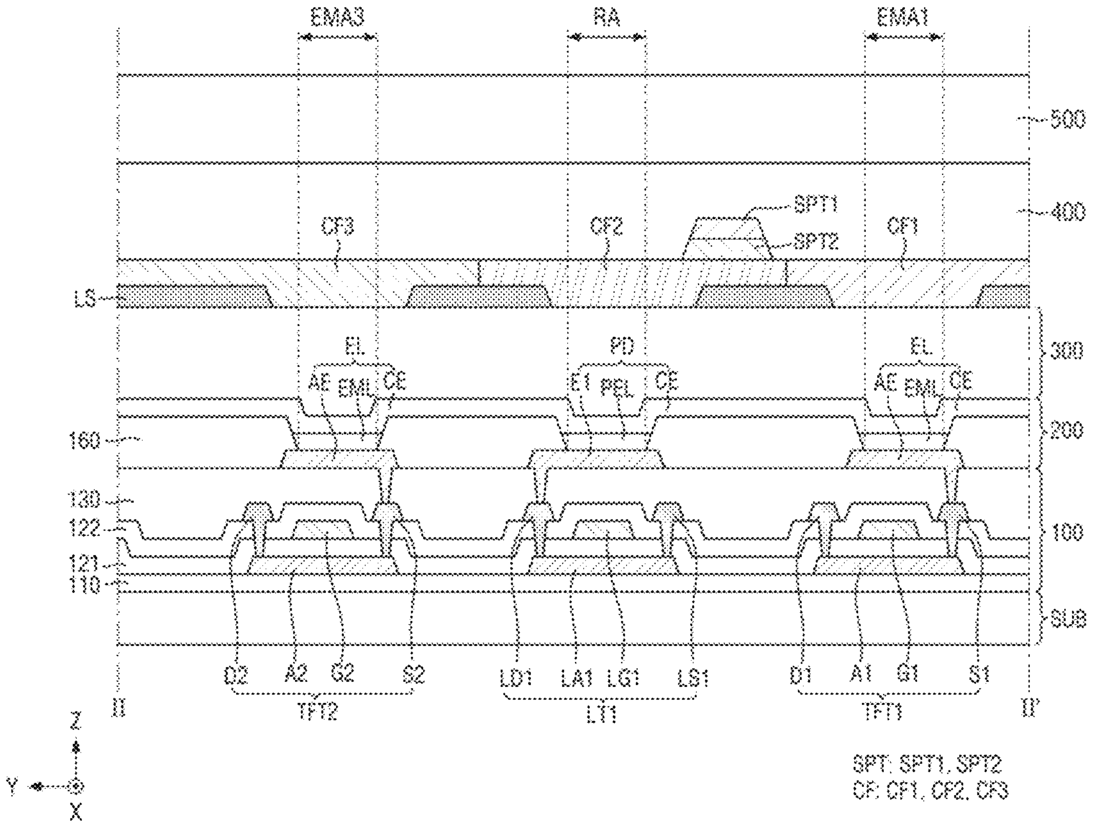
FIG. 17 is a cross-sectional view of a pixel and a photo sensor according to an embodiment of the present disclosure.

FIG. 17 is a cross-sectional view of a pixel and a photo sensor according to an embodiment.

The embodiment of FIG. 17 is substantially the same as the embodiments of FIGS. 9 through 13 except for light blocking patterns SPT, and thus a description thereof will be omitted.

Referring to FIG. 17, the light blocking patterns SPT may be disposed on a second color filter CF2. The light blocking patterns SPT may include a first light blocking pattern SPT1 and a second light blocking pattern SPT2. The second light blocking pattern SPT2 may be disposed on the second color filter CF2, and the first light blocking pattern SPT1 may be disposed on the second light blocking pattern SPT2. In other words, the second light blocking pattern SPT2 and the first light blocking pattern SPT1 may be sequentially disposed on the second color filter CF2. For example, the second light blocking pattern SPT2 may be in direct contact with the second color filter CF2 and the first light blocking pattern SPT1.

The first light blocking pattern SPT1 and the second light blocking pattern SPT2 may overlap each other. The first light blocking pattern SPT1 and the second light blocking pattern SPT2 may overlap a light blocking opening OP_P. For example, a first portion of the first light blocking pattern SPT1 and the second light blocking pattern SPT2 may overlap the light blocking opening OP_P, and a second portion of the first light blocking pattern SPT1 and the second light blocking pattern SPT2 may overlap a light blocking layer LS. In other words, the first light blocking pattern SPT1 and the second light blocking pattern SPT2 may be sequentially disposed in the third direction Z to partially overlap the light blocking opening OP_P.

The light blocking patterns SPT may be made of the same material as color filters CF. For example, the first light blocking pattern SPT1 may be made of the same material as a third color filter CF3, and the second light blocking pattern SPT2 may be made of the same material as a first color filter CF1. For example, the first light blocking pattern SPT1 may be made of the same material as a red color filter R, and the second light blocking pattern SPT2 may be made of the same material as a blue color filter B. For example, when the second color filter CF2 is made of a green color filter G, the first color filter CF1 may be made of the red color filter R, and the first light blocking pattern SPT1 may also be made of the red color filter R. The first light blocking pattern SPT1 may selectively transmit red light and block or absorb green light and blue light. In addition, the third color filter CF3 may be made of the blue color filter B, and the second light blocking pattern SPT2 may also be made of the blue color filter B. The second light blocking pattern SPT2 may selectively transmit blue light and block or absorb red light and green light.

Accordingly, reflected light having a smaller reflection angle than the second reflected light LL2 may be blocked by the light blocking patterns SPT. For example, reflected light having a smaller reflection angle than the second reflected light LL2 must pass through the light blocking patterns SPT to proceed to an optical hole LH. When the first light blocking pattern SPT1 is made of the red color filter R and the second light blocking pattern SPT2 is made of the blue color filter B, the reflected light having a smaller reflection angle than the second reflected light LL2 may sequentially pass through the first light blocking pattern SPT1 and the second light blocking pattern SPT2. As the reflected light passes through the first light blocking pattern SPT1, a green light component or a blue light component of the reflected light is reflected or absorbed by the first light blocking pattern SPT1. A red light component of the reflected light may pass through the first light blocking pattern SPT1. Then, as the reflected light passes through the second light blocking pattern SPT2, the red light component or the green light component of the reflected light is reflected or absorbed by the second light blocking pattern SPT2. The blue light component of the reflected light may pass through the second light blocking pattern SPT2. In other words, the red light component and the blue light component of the reflected light may be blocked or absorbed by the light blocking patterns SPT without passing through the light blocking patterns SPT. In addition, the green light component of the reflected light may be blocked or absorbed by the light blocking patterns SPT as the reflected light passes through the second color filter CF2. In other words, the reflected light having a smaller reflection angle than the second reflected light LL2 may not be incident on a light sensing portion RA.

The arrangement relationship of the first light blocking pattern SPT1 with the light sensing portion RA and the light blocking opening OP_P and the arrangement relationship of the second light blocking pattern SPT2 with the light sensing portion RA and the light blocking opening OP_P are substantially the same as those of the embodiments of FIGS. 9 through 13, and thus a description thereof will be omitted.

Also in the current embodiment, a center of the light blocking opening OP_P is disposed adjacent to one side of the light sensing portion RA, and the light blocking patterns SPT are disposed adjacent to the one side of the light sensing portion RA. Therefore, a fingerprint sensing area LR incident on the light sensing portion RA may be adjusted through the light blocking patterns SPT. Accordingly, the area of the optical hole LH can be reduced, and the fingerprint sensing accuracy of the display device 1 can be increased.

Figure 18:
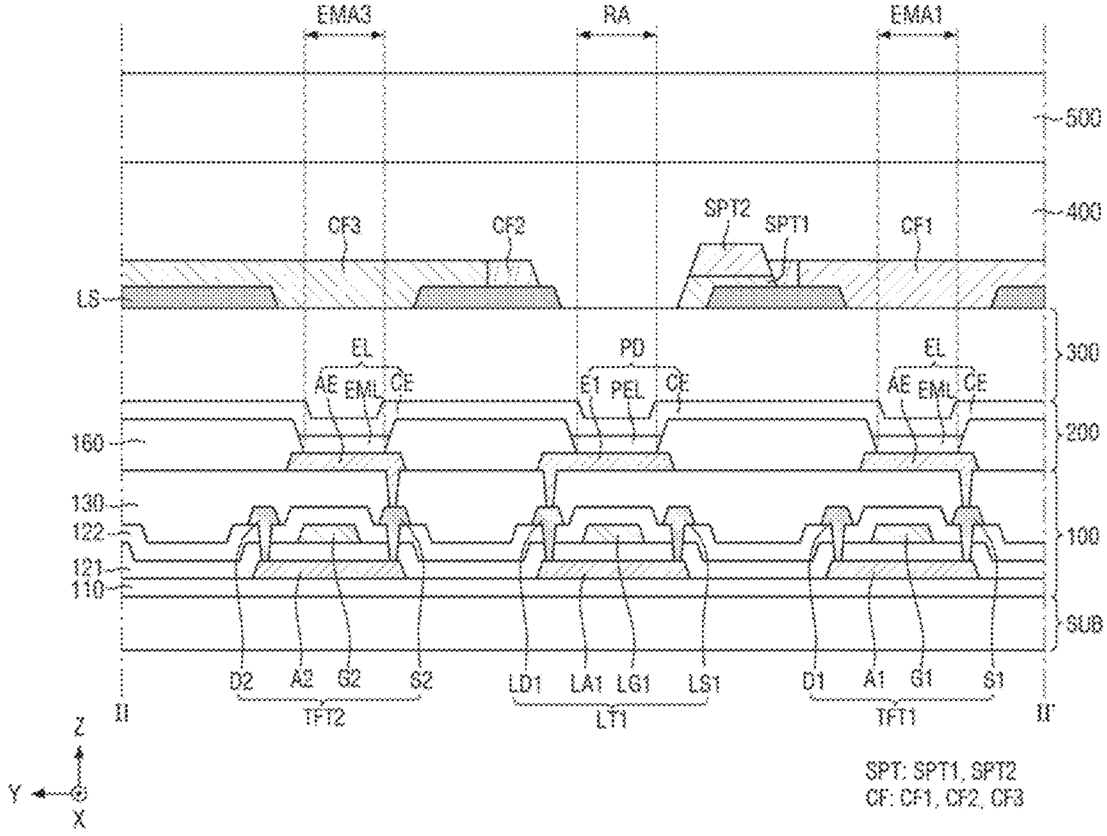
FIG. 18 is a cross-sectional view of a pixel and a photo sensor according to an embodiment of the present disclosure t.

FIG. 18 is a cross-sectional view of a pixel and a photo sensor according to an embodiment.

The embodiment of FIG. 18 is substantially the same as the embodiments of FIGS. 9 through 13 except for a second color filter CF2 and light blocking patterns SPT, and thus a description thereof will be omitted.

Referring to FIG. 18, the second color filter CF2 may not be disposed on a light sensing portion RA. In other words, an opening may be formed in the color filters CF.

There may be an area where the second color filter CF2 is not disposed on a light blocking layer LS. For example, the second color filter CF2 may not be disposed on the light sensing portion RA. In other words, the second color filter CF2 may not overlap the light sensing portion RA in the third direction Z. Accordingly, the second color filter CF2 may not overlap the light sensing portion RA and a light blocking opening OP_P and may not overlap an optical hole LH. In addition, the second color filter CF2 may cover a portion of an upper surface of the light blocking layer LS. The second color filter CF2 may selectively transmit light of a second color (e.g., green light) and block or absorb light of a first color (e.g., red light) and light of a third color (e.g., blue light). For example, the second color filter CF2 may be a green color filter and may include a green colorant. Therefore, the second color filter CF2 may absorb or block first light and third light to prevent the reflected light from being seen from the outside.

The light blocking patterns SPT may be disposed on the light blocking layer LS. For example, a first portion of the light blocking patterns SPT may be disposed on the light blocking layer LS, and a second portion of the light blocking patterns SPT may be disposed on the encapsulation layer 300. In other words, the light blocking patterns SPT may partially overlap the light blocking layer LS. In addition, the light blocking patterns SPT may not overlap the second color filter CF2. The light blocking patterns SPT on the light blocking layer LS may be in contact with a portion of the second color filter CF2.

The light blocking patterns SPT may include a first light blocking pattern SPT1 and a second light blocking pattern SPT2. The first light blocking pattern SPT1 may be disposed on the light blocking layer LS, and the second light blocking pattern SPT2 may be disposed on the first light blocking pattern SPT1.

The first light blocking pattern SPT1 and the second light blocking pattern SPT2 may overlap each other. The first light blocking pattern SPT1 and the second light blocking pattern SPT2 may overlap the light blocking opening OP_P. For example, a first portion of the first light blocking pattern SPT1 and the second light blocking pattern SPT2 may overlap the light blocking opening OP_P, and a second portion of the first light blocking pattern SPT1 and the second light blocking pattern SPT2 may overlap the light blocking layer LS. In other words, the first light blocking pattern SPT1 and the second light blocking pattern SPT2 may be sequentially disposed in the third direction Z to partially overlap the light blocking opening OP_P.

The light blocking patterns SPT may be made of the same material as color filters CF. For example, the first light blocking pattern SPT1 may be made of the same material as a third color filter CF3, and the second light blocking pattern SPT2 may be made of the same material as a first color filter CF1. The arrangement relationship of the first light blocking pattern SPT1 with the light sensing portion RA and the light blocking opening OP_P and the arrangement relationship of the second light blocking pattern SPT2 with the light sensing portion RA and the light blocking opening OP_P are substantially the same as those of the embodiments of FIGS. 9 through 13, and thus a description thereof will be omitted.

Also in the current embodiment, a center of the light blocking opening OP_P is disposed adjacent to one side of the light sensing portion RA, and the light blocking patterns SPT are disposed adjacent to the one side of the light sensing portion RA. Therefore, a fingerprint sensing area LR incident on the light sensing portion RA may be adjusted through the light blocking patterns SPT. Accordingly, the area of the optical hole LH can be reduced, and the fingerprint sensing accuracy of the display device 1 can be increased.

FIGS. 19 through 24 are plan layout views of pixels PX and photo sensors PS of display panels 10 according to embodiments.

The embodiments of FIGS. 19 through 24 are substantially the same as the embodiments of FIGS. 9 through 13 except for the shapes of the pixels PX, the photo sensors PS and light blocking patterns SPT, and thus a description thereof will be omitted.

Referring to FIGS. 19 through 24, each of a plurality of pixels PX included in a display panel 10 may include a plurality of light emitting portions EMA (EMA1 through EMA4) which emit light in an active area AAR. Each of the light emitting portions EMA may be an area in which a pixel electrode AE is exposed by an opening of a bank layer 160 in cross section and an area in which the exposed pixel electrode AE and a light emitting layer EML overlap each other in cross section.

In addition, a plurality of photo sensors PS may be disposed in the active area AAR of the pixels PX. The photo sensors PS may respectively include a plurality of light sensing portions RA which sense light in the active area AAR. Each of the light sensing portions RA may be an area in which a first electrode E1 of a photo sensor PS is exposed by an opening of the bank layer 160 and an area in which the exposed first electrode E1 and a photoelectric conversion layer PEL overlap each other.

A first light emitting portion EMA1 may emit light of a first color or red light, and a second light emitting portion EMA2 and a fourth light emitting portion EMA4 may emit light of a second color or green light. In addition, a third light emitting portion EMA3 may emit light of a third color or blue light. However, the present disclosure is not limited thereto. In an embodiment, the light emitting portions EMA (EMA1 through EMA4) are arranged in rows and columns, substantially as in the embodiment of FIGS. 5 through 9, and thus a description of the arrangement of the light emitting portions EMA will be omitted.

Figure 19:
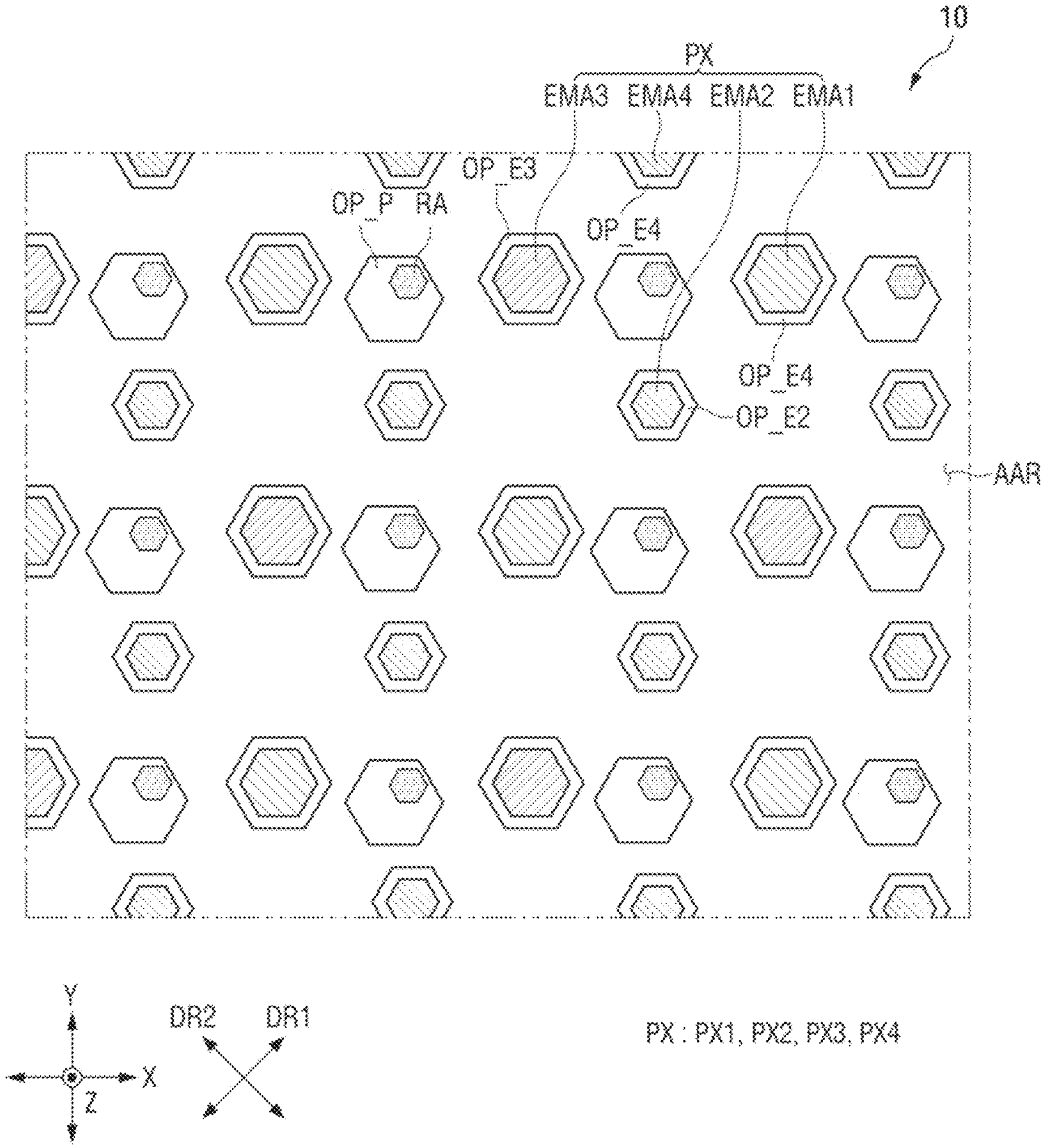
FIGS. 19, 20, 21, 22, 23 and 24 are plan layout views of pixels and photo sensors of display panels according to embodiments of the present disclosure.
Figure 20:
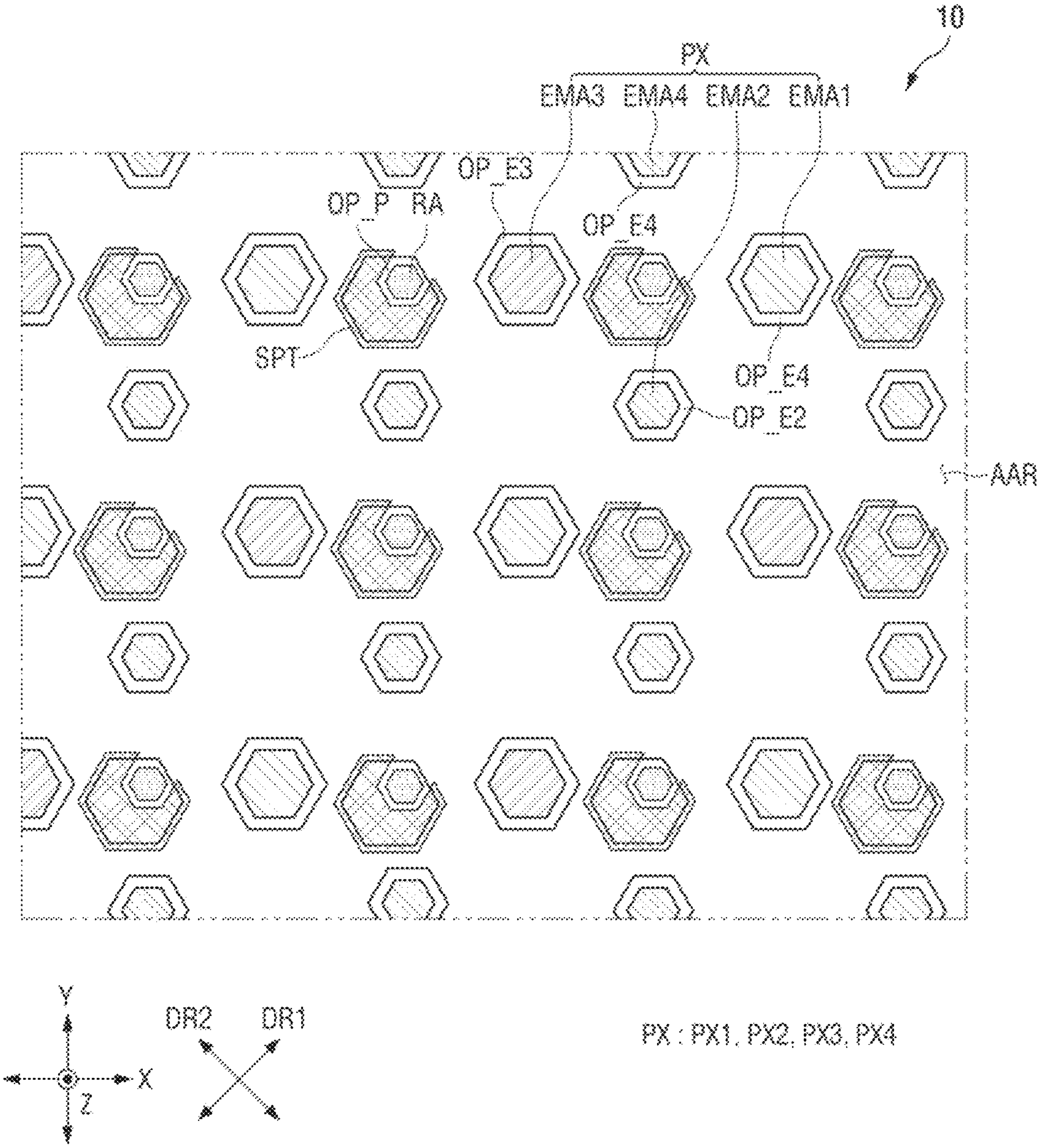
Figure 21:
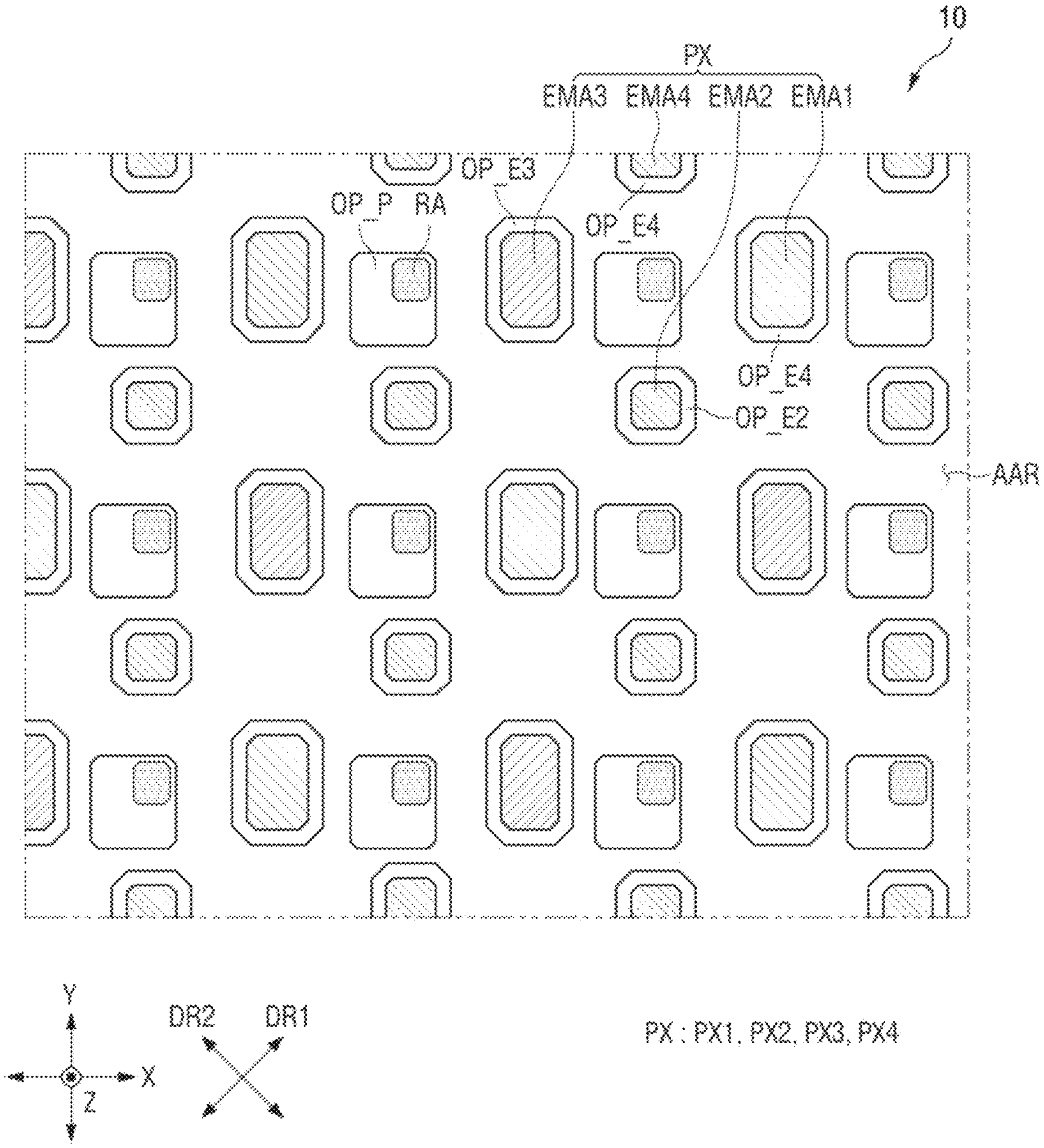
Figure 22:
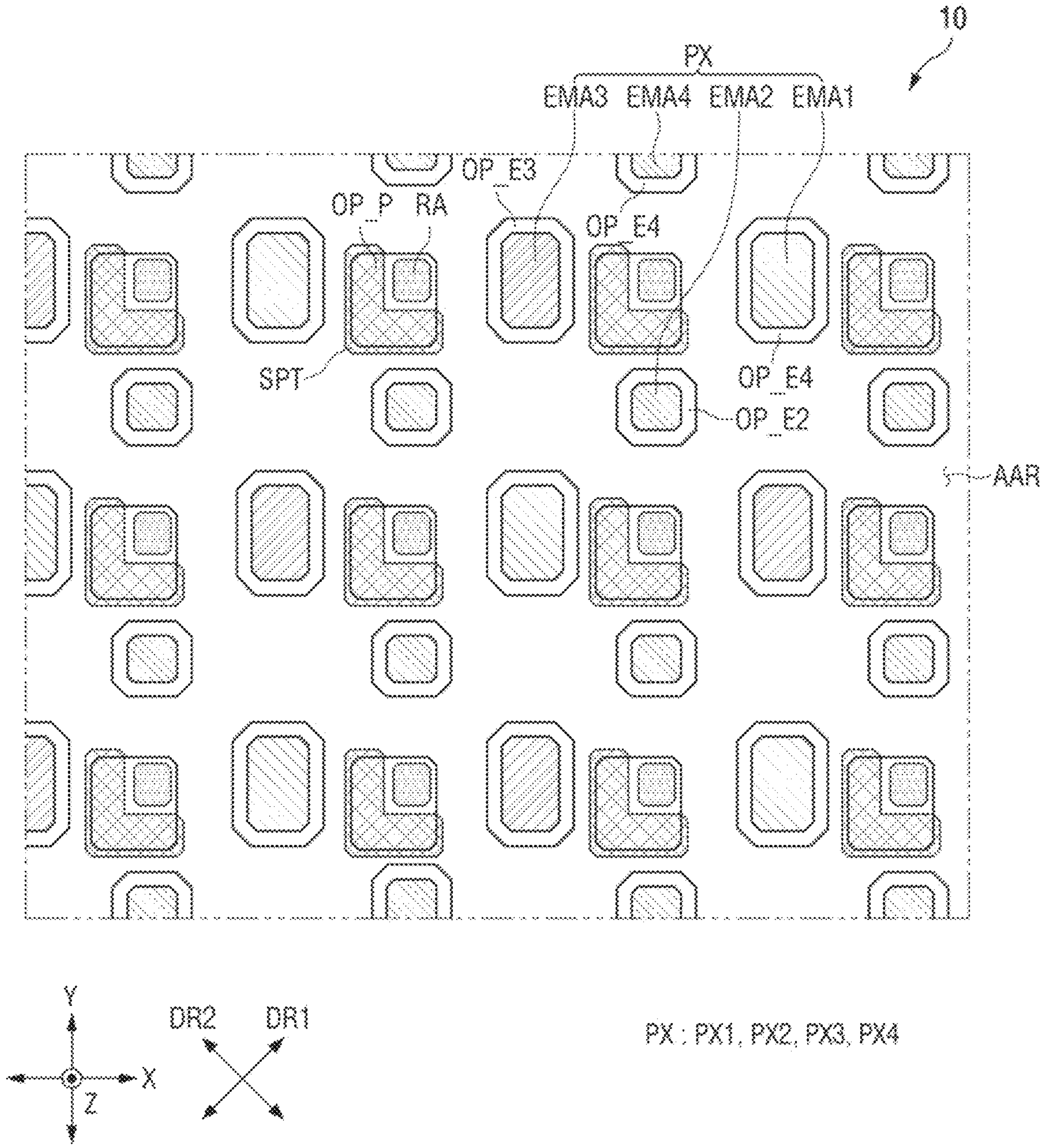
Figure 23:
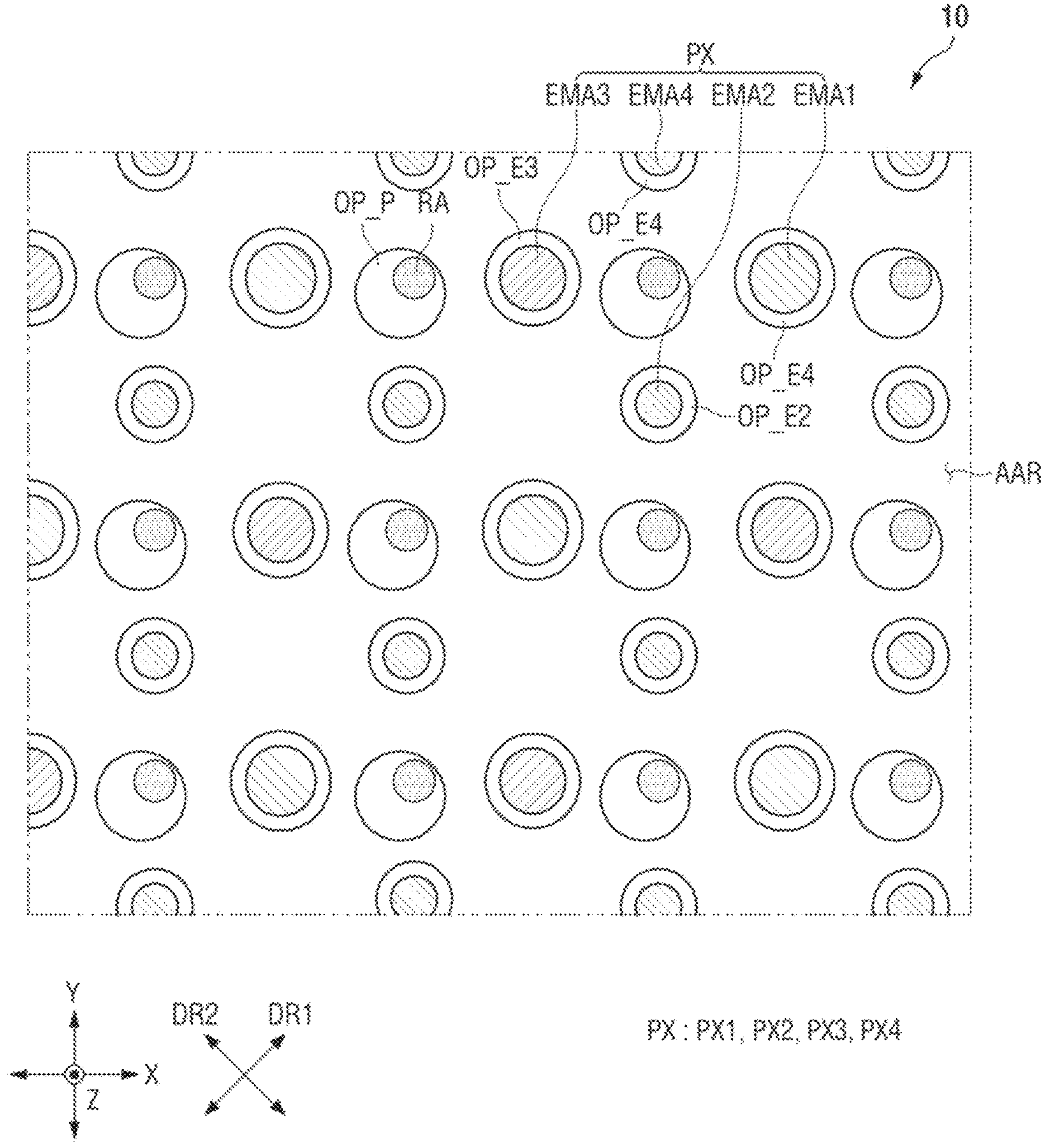
Figure 24:
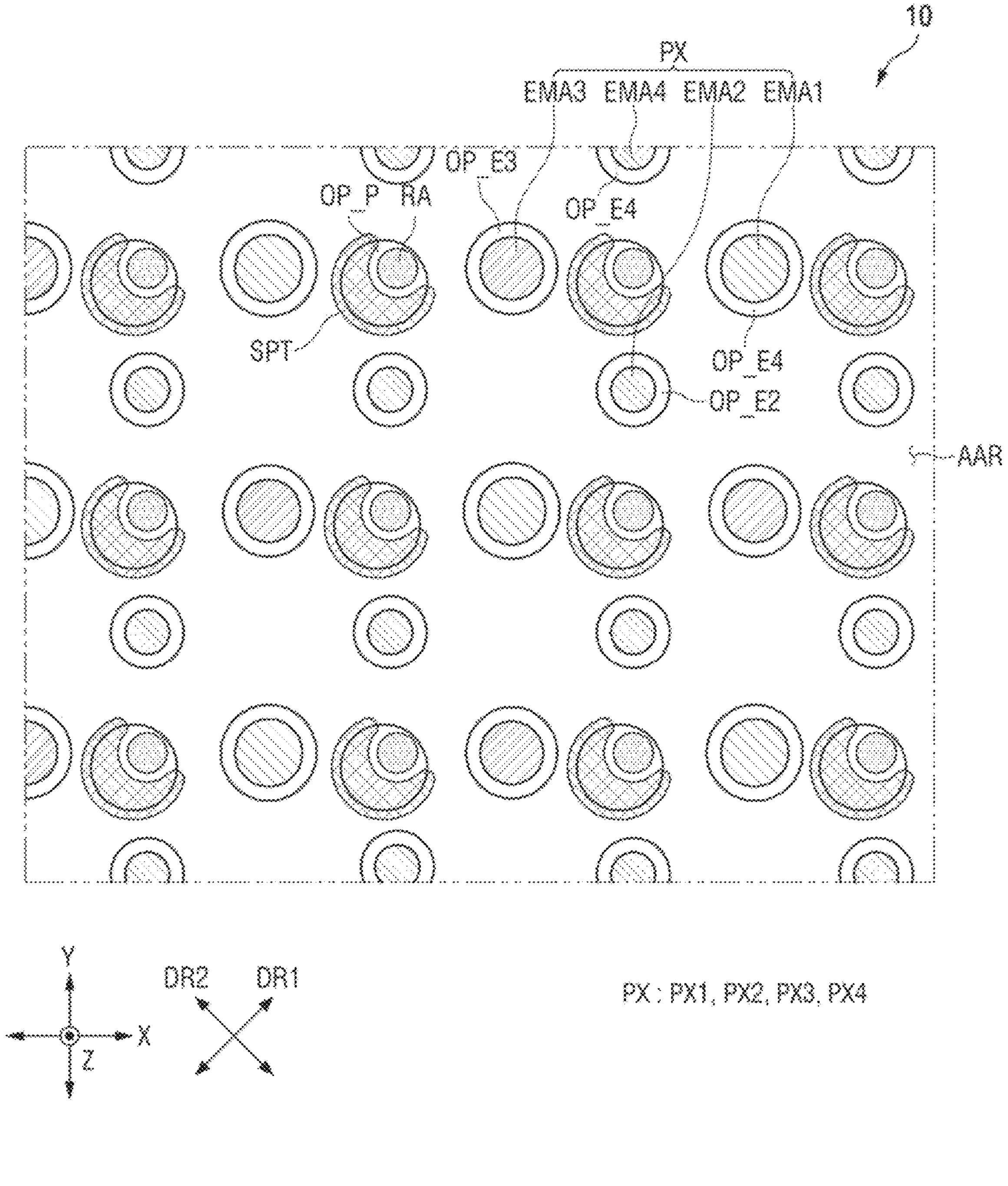

Referring to FIGS. 19 and 20, each of the light emitting portions EMA and the light sensing portions RA may be hexagonal in a plan view. Alternatively, as in the case of FIGS. 21 and 22, each of the light emitting portions EMA and the light sensing portions RA may be octagonal in a plan view. Alternatively, as in the case of FIGS. 23 and 24, each of the light emitting portions EMA and the light sensing portions RA may be circular in a plan view.

A light emitting opening OP_E overlapping each light emitting portion EMA may be provided on the light emitting portion EMA. The light emitting opening OP_E may overlap each light emitting portion EMA to allow light emitted from the light emitting portion EMA to pass therethrough in the third direction Z. For example, a first light emitting opening OP_E1 overlapping the first light emitting portion EMA1 may be provided on the first light emitting portion EMA1, and the first light emitting opening OP_E1 may allow light emitted from the first light emitting portion EMA1 to pass therethrough in the third direction Z. Descriptions of a second light emitting opening OP_E2, a third light emitting opening OP_E3, and a fourth light emitting opening OP_E4 are substantially the same as the description of the first light emitting opening OP_E1 and thus will be omitted.

Each light emitting opening OP_E may be hexagonal in a plan view. Alternatively, as in the case of FIGS. 21 and 22, each light emitting opening OP_E may be octagonal in a plan view. Alternatively, as in the case of FIGS. 23 and 24, each light emitting opening OP_E may be circular in a plan view. In addition, a width of each light emitting opening OP_E may be greater than a width of each light emitting portion EMA. For example, a width of a first side of the first light emitting opening OP_E1 may be greater than a width of a first side of the first light emitting portion EMA1. In addition, a width of a second side of the first light emitting opening OP_E1 may be greater than a width of a second side of the first light emitting portion EMA1. Therefore, a portion of each light emitting opening OP_E may overlap a light emitting portion EMA, and the whole of each light emitting portion EMA may overlap a light emitting opening OP_E. Descriptions of widths of the second light emitting opening OP_E2, the third light emitting opening OP_E3, and the fourth light emitting opening OP_E4 are substantially the same as the description of the width of the first light emitting opening OP_E1 and thus will be omitted.

A light blocking opening OP_P overlapping each light sensing portion RA may be provided on the light sensing portion RA, and an optical hole LH overlapping the light blocking opening OP_P may be provided on the light blocking opening OP_P. The light blocking opening OP_P and the optical hole LH may overlap each light sensing portion RA to allow light, which is to be incident on the light sensing portion RA, to pass therethrough in the third direction Z. Each light blocking opening OP_P may be hexagonal in a plan view. A width of each light blocking opening OP_P may be greater than a width of each light sensing portion RA. For example, a width of one side of each light blocking opening OP_P in the first direction X may be greater than a width of one side of each light sensing portion RA in the first direction X. Therefore, the whole of each light sensing portion RA may overlap a light blocking opening OP_P.

Each light blocking opening OP_P may be hexagonal in a plan view. Alternatively, as in the case of FIGS. 21 and 22, each light blocking opening OP_P may be octagonal in a plan view. Alternatively, as in the case of FIGS. 23 and 24, each light blocking opening OP_P may be circular in a plan view. In addition, a light blocking opening OP_P may be disposed adjacent to one side of each light sensing portion RA. The one side may be, but is not limited to, one side in the first diagonal direction DR1 intersecting the first direction X and the second direction Y. Accordingly, at least a portion of the light blocking opening OP_P may overlap each light sensing portion RA, but at least another portion of the light blocking opening OP_P may overlap the bank layer 160. In other words, at least another portion of the light blocking opening OP_P may not overlap each light sensing portion RA. Accordingly, the light blocking opening OP_P may be disposed closer to the first light emitting portion EMA1 than to the third light emitting portion EMA3. In addition, the light blocking opening OP_P may be disposed closer to the fourth light emitting portion EMA4 than to the second light emitting portion EMA2.

The optical hole LH may be formed on the light blocking opening OP_P by a light blocking pattern SPT on the one side of each light sensing portion RA. The light blocking pattern SPT may be disposed adjacent to the one side of the light blocking opening OP_P in the first diagonal direction DR1. Accordingly, a portion of the light blocking pattern SPT may overlap the light blocking opening OP_P, and the other portion of the light blocking pattern SPT may not overlap the light blocking opening OP_P. In addition, the whole of the optical hole LH may overlap the light blocking opening OP_P, and a portion of the light blocking opening OP_P may not overlap the optical hole LH. In addition, the optical hole LH may be hexagonal in a plan view. Alternatively, as in the case of FIGS. 21 and 22, the optical hole LH may be octagonal in a plan view. Alternatively, as in the case of FIGS. 23 and 24, the optical hole LH may be circular in a plan view.

The light blocking pattern SPT may surround each light sensing portion RA. For example, the shape of the light blocking pattern SPT may be a portion of a hexagonal shape. The light blocking pattern SPT may cover each light blocking opening OP_P such that the optical hole LH has a hexagonal shape in a plan view. However, the present disclosure is not limited thereto. When the optical hole LH has a hexagonal shape in a plan view, the light blocking pattern SPT may also have various shapes. Alternatively, as in the case of FIGS. 21 and 22, the light blocking pattern SPT may cover each light blocking opening OP_P such that the optical hole LH has an octagonal shape in a plan view. Alternatively, as in the case of FIGS. 23 and 24, the light blocking pattern SPT may cover each light blocking opening OP_P such that the optical hole LH has a circular shape in a plan view.

Accordingly, the optical hole LH may be disposed adjacent to one side of each light sensing portion RA. The one side may be one side in the first diagonal direction DR1 intersecting the first direction X and the second direction Y. In other words, the optical hole LH may be disposed on the other side of the light blocking opening OP_P disposed adjacent to the one side of each light sensing portion RA. Accordingly, at least a portion of the optical hole LH may overlap each light sensing portion RA, but at least another portion of the optical hole LH may overlap the bank layer 160. In other words, at least another portion of the optical hole LH may not overlap each light sensing portion RA.

Also in the current embodiment, a center of the light blocking opening OP_P is disposed adjacent to one side of each light sensing portion RA, and the light blocking pattern SPT is disposed adjacent to the one side of each light sensing portion RA. Therefore, a fingerprint sensing area LR incident on each light sensing portion RA may be adjusted through the light blocking pattern SPT. Accordingly, the area of the optical hole LH can be reduced, and the fingerprint sensing accuracy of the display device 1 can be increased.

In concluding the detailed description, those skilled in the art will appreciate that many variations and modifications can be made to the embodiments disclosed herein without substantially departing from the scope of the present disclosure. Therefore, the disclosed embodiments are used in a descriptive sense only and not for purposes of limitation.

What is claimed is:

1. A display device comprising:

a substrate;

a first light emitting portion disposed on the substrate and configured to emit a first light;

a second light emitting portion disposed on the substrate and configured to emit a second light;

a third light emitting portion disposed on the substrate and configured to emit a third light;

a light sensing portion disposed on the substrate and configured to sense an incident light;

a light blocking layer having a light blocking opening that overlaps the light sensing portion;

a first color filter disposed on the first light emitting portion, and configured to transmit the first light, and block the second light and the third light;

a second color filter disposed on the second light emitting portion, overlapping the light blocking opening, and configured to transmit the second light, and block the first light and the third light;

a third color filter disposed on the third light emitting portion, and configured to transmit the third light, and block the first light and the second light; and a first light blocking pattern disposed on the second color filter and overlapping a portion of the light blocking opening.

2. The display device of claim 1, wherein the first light blocking pattern is made of the same material as the first color filter or the third color filter.

3. The display device of claim 1, wherein the first light blocking pattern extends in a first direction and protrudes in a second direction intersecting the first direction.

4. The display device of claim 3, further comprising a second light blocking pattern disposed on the first light blocking pattern, overlapping the first light blocking pattern, and overlapping a portion of the light blocking opening.

5. The display device of claim 4, wherein the first light blocking pattern is made of the same material as the first color filter, and the second light blocking pattern is made of the same material as the third color filter.

6. The display device of claim 5, wherein the first light is a light of a red wavelength band, and the second light is a light of a blue wavelength band.

7. The display device of claim 1, further comprising a bank layer disposed on the substrate and separating the first light emitting portion, the second light emitting portion, the third light emitting portion, and the light sensing portion, wherein a portion of the light blocking opening overlaps the bank layer, and the first light blocking pattern overlaps the bank layer.

8. The display device of claim 1, wherein a portion of the light blocking opening which does not overlap the first light blocking pattern is an optical hole, and a width of the optical hole is smaller than a width of the light blocking opening and greater than a width of the light sensing portion.

9. The display device of claim 8, wherein the width of the optical hole is 10/7 to 2 times the width of the light sensing portion.

10. The display device of claim 1, wherein the light blocking layer further comprises:

a first light emitting opening overlapping the first light emitting portion; and a second light emitting opening overlapping the second light emitting portion, wherein a minimum distance between the first light emitting opening and the light blocking opening is smaller than a minimum distance between the first light emitting opening and the first light blocking pattern.

11. The display device of claim 10, wherein a distance between a center of the first light emitting opening and a center of the light blocking opening is greater than a distance between the center of the first light emitting opening and a center of the light sensing portion.

12. The display device of claim 1, further comprising:

a light emitting layer disposed on the substrate in each of the first, second and third light emitting portions;

a photoelectric conversion layer disposed on the substrate in the light sensing portion; and a common electrode disposed on the light emitting layer and the photoelectric conversion layer, wherein the photoelectric conversion layer overlaps the light blocking opening.

13. A display device comprising:

a substrate;

a plurality of light emitting portions disposed on the substrate and configured to emit a light;

a plurality of light sensing portions disposed on the substrate and configured to sense an incident light;

a light blocking layer disposed on the light sensing portions and having a light blocking opening that overlaps each of the light sensing portions; and a first light blocking pattern disposed on the light blocking layer, wherein the light emitting portions comprise:

a first light emitting portion disposed adjacent to a first side of any one of the light sensing portions in a first direction; and a second light emitting portion disposed adjacent to a second side of the any one of the light sensing portions in the first direction;

wherein a first distance between a center of the light blocking opening and a center of the first light emitting portion is smaller than a second distance between the center of the light blocking opening and a center of the second light emitting portion, and the second distance is greater than a third distance between a center of the first light blocking pattern and the center of the first light emitting portion.

14. The display device of claim 13, wherein the first light blocking pattern overlaps a portion of the light blocking opening and does not overlap each of the light sensing portions.

15. The display device of claim 13, wherein a fourth distance between the center of the light blocking opening and a center of the light sensing portion is smaller than a width of the light sensing portion.

16. The display device of claim 15, wherein the fourth distance is less than 4/7 times of the width of the light sensing portion.

17. The display device of claim 13, wherein a fifth distance between the center of the first light blocking pattern and the center of the light blocking opening is smaller than a width of the light sensing portion.

18. The display device of claim 13, further comprising:

a third light emitting portion disposed adjacent to the first side of the any one of the light sensing portions in a second direction intersecting the first direction; and a fourth light emitting portion disposed adjacent to the second side of the any one of the light sensing portions in the second direction, wherein a distance between the center of the light blocking opening and a center of the third light emitting portion is smaller than a distance between the center of the light blocking opening and a center of the fourth light emitting portion, and the first light blocking pattern overlaps a portion of the light blocking opening in the second direction.

19. An electronic device comprising:

a substrate;

a first light emitting portion disposed on the substrate and configured to emit a first light;

a second light emitting portion disposed on the substrate and configured to emit a second light;

a third light emitting portion disposed on the substrate and configured to emit a third light;

a light sensing portion disposed on the substrate and configured to sense an incident light;

a light blocking layer having a light blocking opening that overlaps the light sensing portion;

a first color filter disposed on the first light emitting portion, and configured to transmit the first light, and block the second light and the third light;

a second color filter disposed on the second light emitting portion, overlapping the light blocking opening, and configured to transmit the second light, and block the first light and the third light;

a third color filter disposed on the third light emitting portion, and configured to transmit the third light, and block the first light and the second light;

a first light blocking pattern disposed on the light blocking layer and overlapping a portion of the light blocking opening; and a second light blocking pattern disposed on the first light blocking pattern and overlapping the first light blocking pattern.

20. The electronic device of claim 19, wherein the first light blocking pattern is made of the same material as the first color filter, and the second light blocking pattern is made of the same material as the third color filter.

* * * * *